United States Patent
Qiang et al.

(10) Patent No.: US 12,399,286 B2
(45) Date of Patent: Aug. 26, 2025

(54) TIME-WALK CORRECTION USING MULTIPLE ENERGY MEASUREMENTS

(71) Applicant: CANON MEDICAL SYSTEMS CORPORATION, Otawara (JP)

(72) Inventors: Yi Qiang, Vernon Hills, IL (US); Kent C. Burr, Vernon, CT (US)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 356 days.

(21) Appl. No.: 18/086,966

(22) Filed: Dec. 22, 2022

(65) Prior Publication Data
US 2024/0210575 A1    Jun. 27, 2024

(51) Int. Cl.
  *G01T 1/20*  (2006.01)
  *G01T 1/164* (2006.01)
  *G01T 1/208* (2006.01)
  *G01T 1/29*  (2006.01)

(52) U.S. Cl.
  CPC .......... *G01T 1/2006* (2013.01); *G01T 1/1644* (2013.01); *G01T 1/2008* (2013.01); *G01T 1/208* (2013.01); *G01T 1/2985* (2013.01)

(58) Field of Classification Search
  CPC ... G01T 1/1644; G01T 1/2006; G01T 1/2008; G01T 1/208; G01T 1/2985
  See application file for complete search history.

(56) References Cited

U.S. PATENT DOCUMENTS

| | | | |
|---|---|---|---|
| 11,841,472 B2* | 12/2023 | Li | G01T 1/2985 |
| 11,846,737 B2* | 12/2023 | Kawata | G01T 1/363 |
| 2014/0209804 A1* | 7/2014 | Lee | G01T 1/2985 |
| | | | 250/362 |

FOREIGN PATENT DOCUMENTS

CN    119596372 A  *  3/2025

OTHER PUBLICATIONS

Kratochwil et al, "Pushing Cherenkov PET with BGO via coincidence time resolution classification and correction," Phys. Ed. Biol. 65 (2020) 115004, Jun. 2, 2020, 7 pages, Institute of Physics and Engineering in Medicine.

* cited by examiner

*Primary Examiner* — David P Porta
*Assistant Examiner* — Casey Bryant
(74) *Attorney, Agent, or Firm* — Oblon, McClelland, Maier & Neustadt, L.L.P.

(57) ABSTRACT

An apparatus and method are provided to correct for time-walk errors during photon detections (e.g., detecting gamma rays). A time-walk correction is determined using measurements of energy (or charge) that apply different time windows, enabling corrections accounting for variations in the ratio between fast and slow components in the detected pulse. For example, one time window can be used to integrate the leading end of the pulse, thereby predominantly measuring the fast component, while a second window is used to integrate a trailing end of the pulse to predominantly measure the slow component. Alternatively or additionally, low-pass and high-pass filters may select the slow and fast components, respectively. The time-walk correction is a function of multiple measurements representing different components (e.g., fast and slow) of the pulse shape.

20 Claims, 23 Drawing Sheets

TIME-WALK CORRECTION USING MULTIPLE ENERGY MEASUREMENTS

FIELD

The field of the disclosure relates to time detection of photons (e.g., detection of gamma rays in a positron emission tomography (PET) scanner), and, more particularly, to improved time detection using time-walk corrections that account for variability in the response time of the photon detectors.

BACKGROUND

In positron emission tomography (PET) imaging, a tracer agent is introduced into a patient, and the physical and bio-molecular properties of the agent cause it to concentrate at specific locations in the patient's body. The tracer emits positrons, resulting in an annihilation event that occurs when the positron collides with an electron. This annihilation event produces two gamma rays (at 511 keV) traveling at substantially 180 degrees apart.

PET imaging systems use detectors positioned around the patient to detect coincidence pairs of gamma rays. A ring of detectors can be used to detect gamma rays coming from each angle. Thus, a PET scanner can be substantially cylindrical to maximize the capture of the isotropic radiation. A PET scanner can be composed of several thousand individual crystals (e.g., Lutetium Yttrium Orthosilicate (LYSO) or other scintillating crystal) which are arranged in two-dimensional scintillator arrays, and the two-dimensional scintillator arrays can be packaged in modules with photodetectors to measure the light pulses from respective scintillation events. For example, the light from respective elements of a scintillator crystal array can be shared among multiple photomultiplier tubes (PMTs) or can be detected by silicon photomultipliers (SiPMs) having a one-to-one correspondence with the elements of a scintillator crystal array.

To reconstruct the spatio-temporal distribution of the tracer via tomographic reconstruction principles, each detected event can be characterized for its energy (i.e., amount of light generated), its location, and its timing. By detecting the two gamma rays, and drawing a line between their locations, i.e., the line-of-response (LOR), one can determine the likely location of the original disintegration. The timing information can also be used to determine a statistical distribution along the LOR for the annihilation event. This statistical distribution along the LOR can be determined based on a time-of-flight (TOF) between the two gamma rays. Using a large data set, a three-dimensional density can be estimated for the tracer agent is introduced into a patient. This three-dimensional density can be estimated using a tomographic reconstruction process.

TOF-PET detectors can be used in reconstructing images with greater contrast than traditional PET detectors. Specifically, TOF-PET detectors use timing information to produce the contrasted images. In order to achieve the best timing performance of TOF-PET detectors, the various sources of timing variation and inaccuracies should be minimized. For example, when comparators are used for timing measurement, time-walk errors can arise. Correcting for these time-walk errors can yield better results when reconstructing images. The methods and apparatuses described herein provide improved time-walk corrections.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

One embodiment illustrated herein includes a device for determining a time of a photon detection. The device includes a first circuit that measures a time of an electrical pulse generated by a photon detection. The device includes a second circuit that measures a first magnitude of a first part of the electrical pulse. The device includes a third circuit that measures a second magnitude of a second part of the electrical pulse, which is different from the first part of the electrical pulse. The device includes processing circuitry that determines a time-walk correction based on the first magnitude and the second magnitude, and the processing circuitry corrects the measured time of the electrical pulse using the time-walk correction.

A further embodiment of the device includes a photodetector that converts a photon to a photocurrent. And the device includes a buffer amplifier that amplifies the photocurrent and thereby outputs the electrical pulse, which feeds into the second circuit and the third circuit.

A further embodiment is any of the aforementioned embodiments of the device, and the device further includes that the photon is a gamma-ray photon and the photodetector comprises a conversion material that is a scintillator configured to convert the gamma-ray photon to the plurality of photoelectrons.

A further embodiment is any of the aforementioned embodiments of the device, and the device further includes that the first circuit is AC-coupled via a capacitor to a photodetector.

A further embodiment is any of the aforementioned embodiments of the device, and the device further includes that the first magnitude of the first part of the electrical pulse corresponds to a first time window, and the second magnitude of the second part of the electrical pulse corresponds to a second time window. A mean time of the first time window is earlier than a mean time of the second time window.

A further embodiment is any of the aforementioned embodiments of the device, and the device further includes that the electrical pulse includes a fast component and a slow component, and a ratio of the fast component to the slow component is greater for the first magnitude than for the second magnitude.

A further embodiment is any of the aforementioned embodiments of the device, and the device further includes that the first circuit includes a high-pass filter. The second circuit includes a low-pass filter, which selectively transmits a slow component of the electrical pulse. The third circuit includes a high-pass filter or a band-pass filter, which selectively transmits a fast component of the electrical pulse.

A further embodiment is any of the aforementioned embodiments of the device, and the device further includes that the first circuit has a comparator circuit that outputs a comparator signal when a rising edge of the electrical pulse exceeds a predefined threshold. The first circuit has a time-to-digital converter that generates a digital signal representing a time when the comparator signal is received at the time-to-digital converter.

A further embodiment is any of the aforementioned embodiments of the device, and the device further includes that the second circuit has a first integrator circuit that integrates a charge of the electrical pulse within a first time window. The second circuit has a first analog-to-digital converter that converts the integrated charge in the first time window to a digital value, which digital value is the first magnitude.

A further embodiment is any of the aforementioned embodiments of the device, and the device further includes that the third circuit has a second integrator circuit that integrates the charge of the electrical pulse within a second time window. The third circuit has a second analog-to-digital converter that converts the integrated charge in the second time window to a digital value, which digital value is the second magnitude.

A further embodiment is any of the aforementioned embodiments of the device, and the device further includes that the processing circuitry determines the time-walk correction using a function having parameters that were determined by curve fitting calibration data of the time walk as a function of the first magnitude and the second magnitude.

A further embodiment is any of the aforementioned embodiments of the device, and the device further includes that the function is factorable into a first function of the first magnitude and a second function of the second magnitude, the function being either a sum of the first function and the second function or a product of the first function and the second function.

A further embodiment is any of the aforementioned embodiments further including a fourth circuit that measures a third magnitude of a third part of the electrical pulse, which is different from the first part of the electrical pulse and is different from the second part of the electrical pulse. The processing circuitry determines the time-walk correction based on the first magnitude, the second magnitude, and the third magnitude.

Another embodiment illustrated herein is a method for determining a time of a photon detection. The method includes: (1) using a first circuit to measure a time of an electrical pulse generated by a photon detection; (2) using a second circuit to measure a first magnitude of a first part of the electrical pulse; (3) using a third circuit to measure a second magnitude of a second part of the electrical pulse, which is different from the first part of the electrical pulse; and (4) using processing circuitry to determine a time-walk correction. The time-walk correction is determined based on the first magnitude and the second magnitude. The processing circuitry corrects the measured time of the electrical pulse using the time-walk correction.

A further embodiment of the method includes generating a photocurrent, the photocurrent being generated by a photodetector. The method uses a buffer amplifier to amplify the photocurrent, and the buffer amplifier outputs the electrical pulse, which feeds into the second circuit and the third circuit.

A further embodiment is any of the aforementioned embodiments of the method, and the method further includes AC-coupling, via a capacitor, the photodetector to the first circuit.

A further embodiment is any of the aforementioned embodiments of the method, and the method further includes using the second circuit to measure the first magnitude further including that the first part of the electrical pulse corresponds to a first time window in which the electrical pulse is measured. The method further includes using a third circuit to measure a second magnitude further including that the second part of the electrical pulse corresponds to a second time window in which the electrical pulse is measured. The second time window is staggered in time with respect to the first time window, and/or a mean time of the first time window is different than a mean time of the second time window.

A further embodiment is any of the aforementioned embodiments of the method, and the method further includes that the electrical pulse includes a fast component and a slow component, and a ratio of the fast component to the slow component is greater for the first magnitude than for the second magnitude.

A further embodiment is any of the aforementioned embodiments of the method, and the method further includes filtering, using a first filter, the electrical pulse before the first circuit, the first filter being a high-pass filter or a band-pass filter.

A further embodiment is any of the aforementioned embodiments of the method, and the method further includes filtering, using a second filter, the electrical pulse before the second circuit, the second filter being a low-pass filter.

A further embodiment is any of the aforementioned embodiments of the method, and the method further includes filtering, using a third filter, the electrical pulse before the third circuit, the third filter being a high-pass filter or a band-pass filter.

A further embodiment is any of the aforementioned embodiments of the method, and the method further includes that the step of using the first circuit to measure the time of the electrical pulse includes: (1) using a comparator circuit to compare the electrical pulse to a predefined threshold and output a comparator signal when a rising edge of the electrical pulse exceeds the predefined threshold, and (2) using a time-to-digital converter to generate a digital signal representing a time when the comparator signal is received.

A further embodiment is any of the aforementioned embodiments of the method, and the method further includes that the step of using the second circuit to measure the first magnitude further includes: (1) using a first integrator circuit to integrate a charge of the electrical pulse within a first time window, and (2) using a first analog-to-digital converter to convert the integrated charge in the first time window to a digital value, which digital value is the first magnitude.

A further embodiment is any of the aforementioned embodiments of the method, and the method further includes that the step of using the third circuit to measure the second magnitude further includes: (1) using a second integrator circuit to integrate a charge of the electrical pulse within a second time window, and (2) using a second analog-to-digital converter to convert the integrated charge in the second time window to a digital value, which digital value is the second magnitude.

A further embodiment is any of the aforementioned embodiments of the method, and the method further includes that the step of determining the time-walk correction further includes using the processing circuitry configured to determine the time-walk correction using a function having parameters that were determined by curve fitting calibration data of the time walk as a function of the first magnitude and the second magnitude.

A further embodiment is any of the aforementioned embodiments of the method, and the method further includes using a fourth circuit to measure a third magnitude of a third part of the electrical pulse, which is different from the first part of the electrical pulse and is different from the second part of the electrical pulse. The method further includes using the processing circuitry to determine the time-walk correction based on the first magnitude, the second magnitude, and the third magnitude.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

As discussed above, the accuracy of image reconstruction using positron emission tomography (PET) depends on the resolution and accuracy with which coincidence counts can be detected. Spatial accuracy is important for determining the line of response (LOR) of an annihilation event, and temporal accuracy is important for determining the position of the annihilation event along the LOR. That is, time-of-flight (TOF) determinations enable the point of a positron emission event along a line of response (LOR) to be determined (as illustrated in FIG. 1B). The accuracy of the timing information can be improved by correcting the timing information for time walk, which is discussed in more detail below.

Figure 1A:
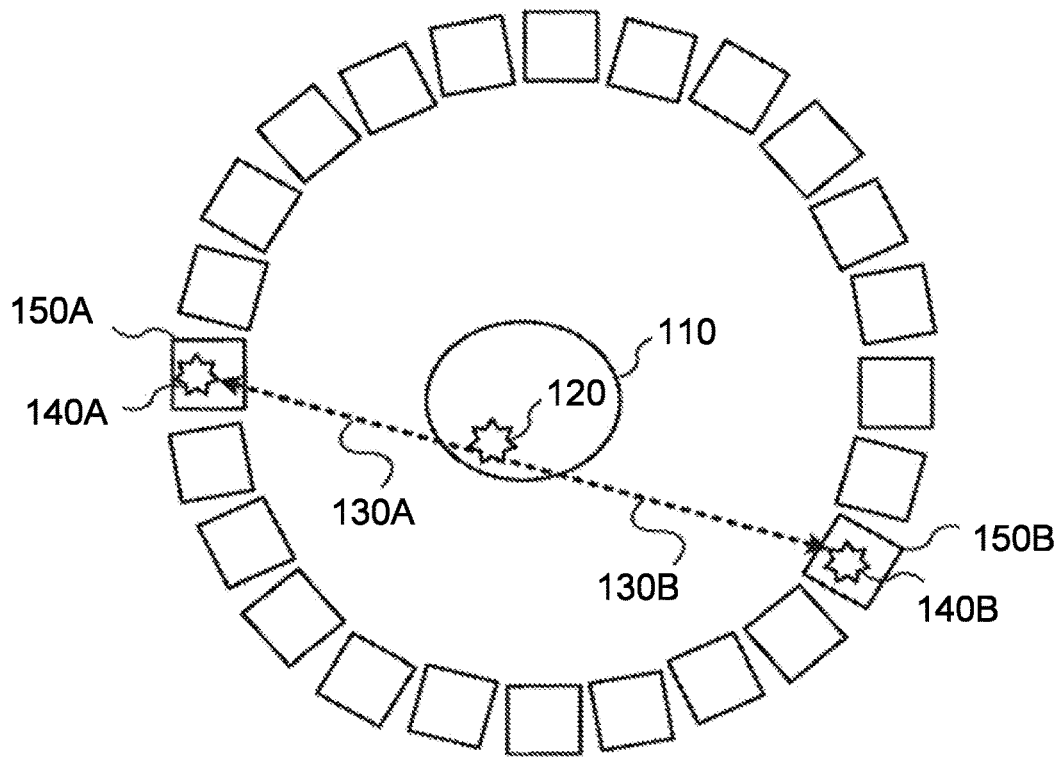
FIG. 1A illustrates a positron-electron annihilation event in a positron emission tomography (PET) scanner, according to one embodiment.
Figure 1B:
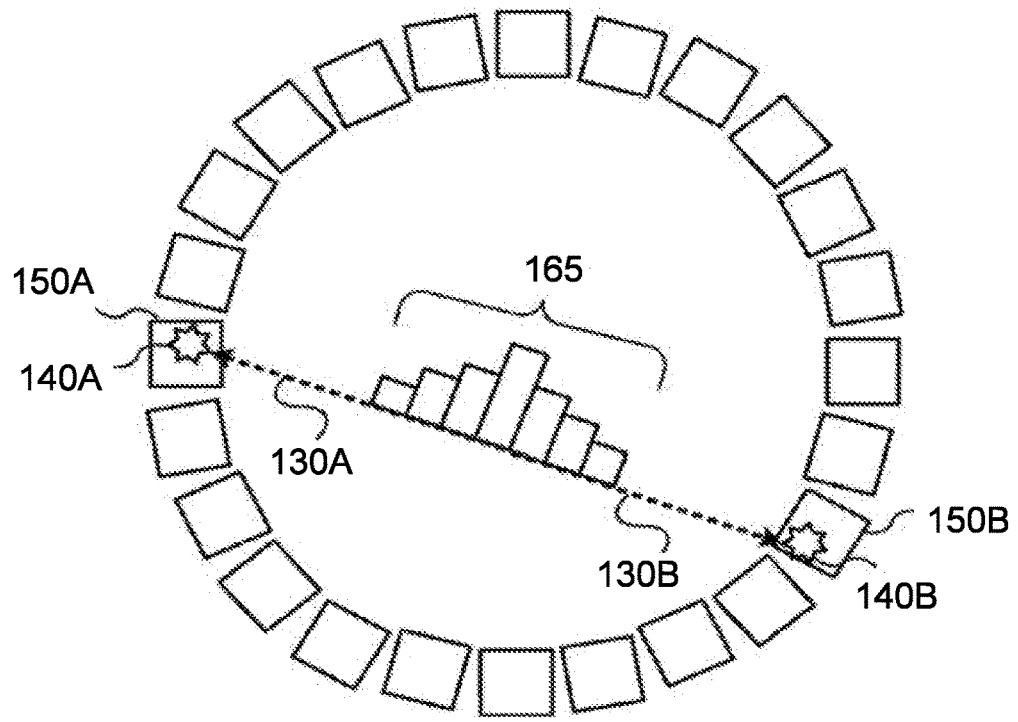
FIG. 1B illustrates an annihilation event in a time-of-flight (TOF) PET scanner.

Referring now to the drawings wherein like reference numerals designate identical or corresponding parts throughout the several views, FIG. 1A is a nonlimiting example of a PET system performing coincidence detection of a positron annihilation event, which can be used for tomographic image reconstruction. FIG. 1A shows a source 110 (e.g., a patient who has been injected with a tracer), an annihilation event 120 in which an emitted positron annihilates an electron to generate a pair of gamma rays that propagate in opposite direction along respective legs 130A and 130B of the line of response (LOR) until their arrivals 140A and 140B are respectively detected at the corresponding detector elements 150A and 150B. A PET image can then be reconstructed using the position and timing information of the signals measured at the detector elements 150A and 150B. The reconstructed image represents the spatial distribution of radioactivity (e.g., tracer density) of the source 110.

In tomographic reconstruction, the LOR including the ray segments 130A and 130B is drawn between the positions of the detector elements 150A and 150B, corresponding to the trajectories of the gamma rays that were detected at the detector elements 150A and 150B. The LOR includes a first portion 130A and a second portion 130B along which the first and second gamma rays propagated.

FIG. 1B is a non-limiting example time-of-flight (TOF) PET system illustrating the same event as FIG. 1A. In addition to using the spatial information to determine the LOR, FIG. 1B, illustrates using the timing information to determine an estimated position 165 of the annihilation event along the LOR. The difference between the length L1 of the first portion 130A and the length L2 of the second portion 130B can be used to calculate the actual time difference between the two detection events, i.e., $\Delta t = t1-t2 = (L1-L2)/c$, wherein t1 (t2) is the time of the first (second) arrival 140A (140B) and c is the speed of light. Working in reverse, TOF measurements can be used to estimate the length L1 and L2 of the first and second portions 130A and 130B, e.g., by acquiring the measured time difference. The variance of the statistical distribution of the estimated position 165 is limited by the precision and accuracy with which the timing information is measured.

The arrival time of a photon (e.g., the photon is a quantum of electromagnetic energy, such as a gamma ray) in a detector is often measured using a leading edge discrimination method. The accuracy of such a measurement is limited by the threshold chosen for the discriminator and how fast the detector responds to the detected photon. For example, the time it takes the detector signal to rise above the discriminator threshold can depend on the signal's amplitude. That is, the detection time suffers from variability due to the signal amplitude. This variability due to the variations arising from when the rising edge of the signal crosses the discriminator threshold is called time walk. Fortunately, time walk can usually be corrected as a function of the amplitude of the signal (or the total charge). This practice is called time-walk correction.

Time walk can limit the accuracy of the timing information. Accordingly, the methods described herein provide an approach to correcting time walk, even for the case in which the pulse shape corresponding to a detection event changes due to varying contributions of fast and slow components constituting the pulse.

Figure 2A:
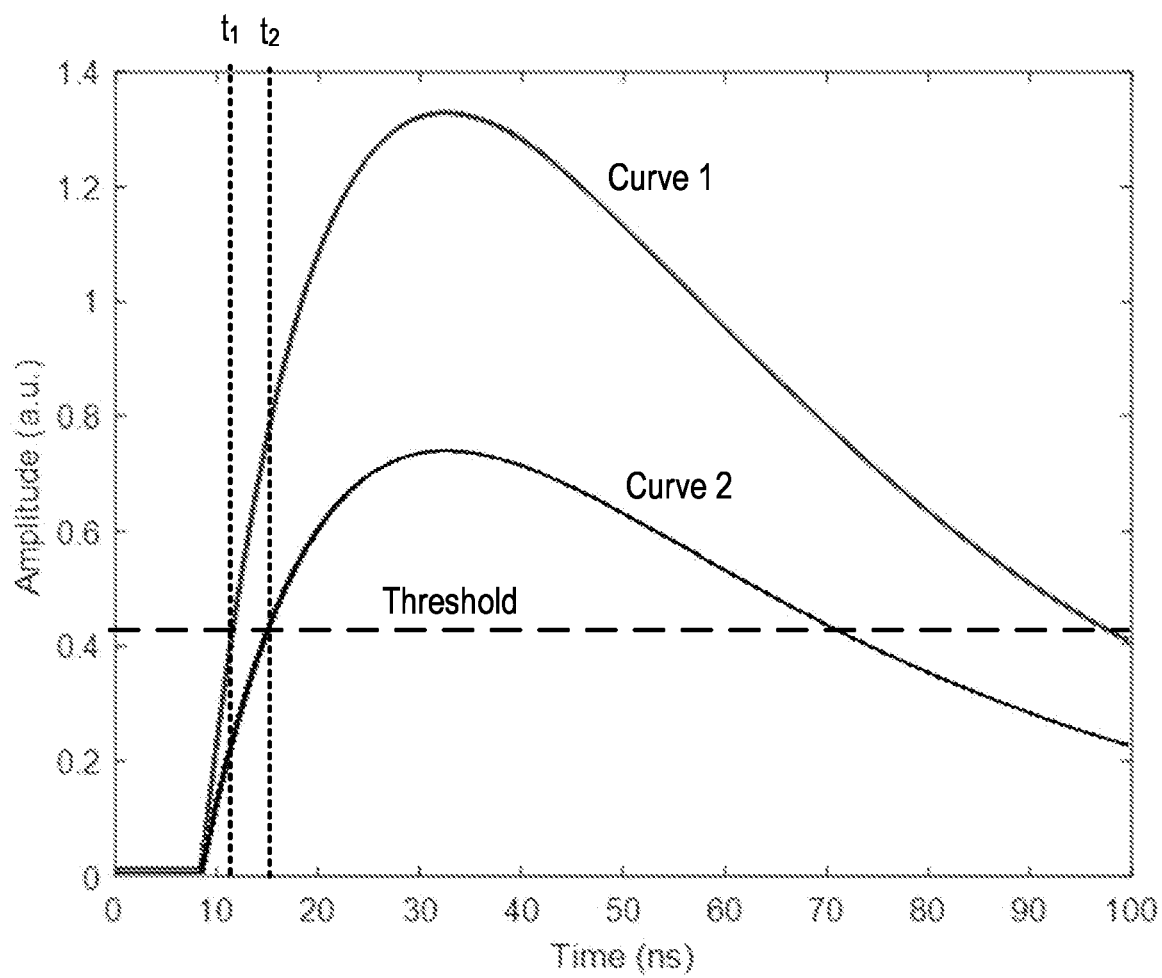
FIG. 2A illustrates time walk due arising from different pulse amplitudes for pulses having a same pulse shape, according to one embodiment.

FIG. 2A illustrates an example of time walk between curve 1 and curve 2. In this example, curve 1 and curve 2 represent pulse shapes having a same shape but different energies/charges (e.g., different areas under the curve). The timing of detection events is given when the respective curves cross a predefined threshold. Curve 1 crosses the threshold at time t1, which is earlier than the time t2 when curve 2 crosses the threshold. Thus, even though the two detection events should be simultaneous, there is a difference between the measured times for the detection events. This difference is an example of time walk, and, for this particular example, the time walk can be corrected based on the measured energies for the respective curves. The energies can be measured, e.g., by using an integrating detecting to measure the area under the respective curves to obtain the total charge for each of the detection events.

Figure 2B:
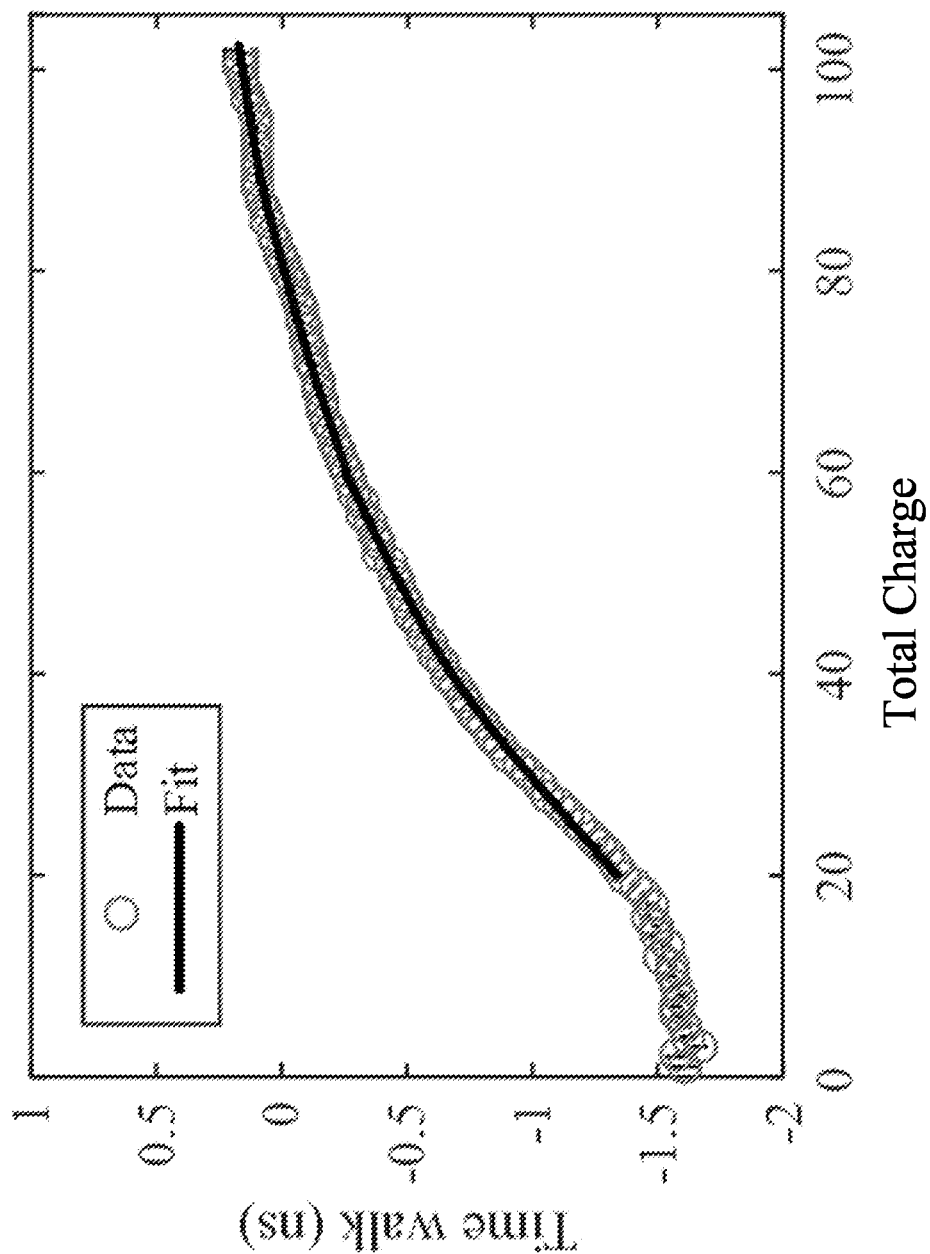
FIG. 2B illustrates a parameterization of the time walk as a function of total charge, according to one embodiment.

FIG. 2B shows a parametrization of the time walk as a function of the total charge. For example, data may be measured for pulses with different energies with known arrival times. FIG. 2B shows a plot of measured data for the time walk (i.e., the time difference between the known arrival time and the time at which the rising pulse edge exceeds the threshold) and a curve fit to the data that parameterizes the time walk. The time walk can be parameterized by optimizing coefficients of a predefined function. For example, the parameterization can be performed by selecting coefficients of a predefined function to minimize an error measure (e.g., the least square error) between a curve fit based on the predefined function and measured data of the time walk. Accordingly, the time walk can be corrected via a time-walk calibration, as described in U.S. patent application Ser. No. 16/212,326, incorporated herein by reference in its entirety.

The time-walk parameterization in FIG. 2B assumes that the total pulse energy can vary among detection events, but this particular parameterization assumes that the pulse shape remains constant (when normalized for pulse energy). This assumption is not valid when the pulse shapes for detection events vary due to a varying ratio between fast response and slow response components. The methods described herein advantageously address this issue of time-walk correction for pulses having varying pulse shapes.

Figure 3:
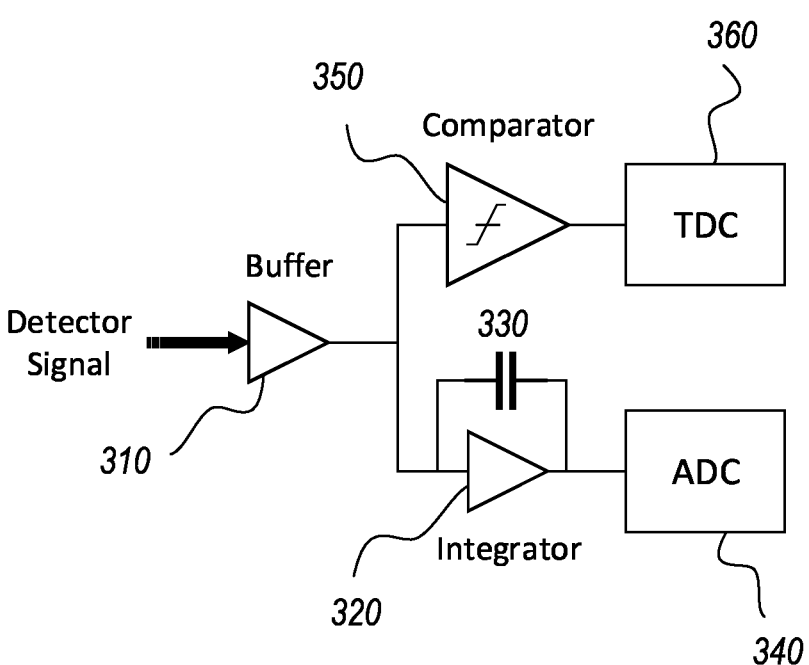
FIG. 3 illustrates a schematic diagram of a circuit measuring time and integrated charge for a pulse arising from a detection event, according to one embodiment.

FIG. 3 illustrates a detection circuit 300. The detection circuit 300 can be used, e.g., in a gamma ray detector (GRD) of a PET scanner. The detection circuit 300 includes a buffer amplifier 310 that receives a detector signal from a GRD (e.g., a scintillator with a photodetector, such as a photomultiplier tube (PMT) or a silicon photomultiplier (SiPM). The buffer amplifier 310 buffers and fans out the detector signal to a comparator circuit 350 and an integrator circuit 320. The integrator 320 can be, e.g., an operational amplifier and a capacitor 330 that are configured to integrate the incoming charge and output a voltage proportional to the integrated charge. An analog-to-digital converter (ADC) 340 converts the output voltage to an analog signal. The comparator circuit 350 transitions from low to high voltage when the input signal exceeds a threshold voltage, and the time-to-digital converter (TDC) 360 generates a digital signal representing the time at which the input signal from the comparator 350 transitions from low to high voltage.

The buffer amplifier 310 is used to terminate the detector with a desired termination impedance, and fans out the signal from the detector. Then, the TDC 360 combined with the comparator 350 measures the time, t, when the signal exceeds the predefined threshold. The ADC 340 digitizes the total charge of the signal, E, collected by the integrator 320. Then a walk correction is applied to the measured t to get a more accurate estimation of the arrival time of the signal. In certain embodiments, the corrected time t' is given by $$t' = t - f(E),$$

wherein $f(E)$ is time-walk correction function that is a function of to the pulse energy E (or the total charge measured by the integrator 320). The function $f(E)$ describes the time walk, i.e., how the measured time changes as a function of total charge. In certain embodiments, the time-walk correction function has a functional form of $$f(E) = 1/(\alpha E + \beta),$$

wherein, $\alpha$ and $\beta$ are parameters determined via curve fitting. The values of the parameters $\alpha$ and $\beta$ can be calibrated for each detector. The above functional form of the time-walk correction function is based on the assumption the pulse shape is the same for each detection pulse (but with different magnitudes) and the assumption that the portion of the leading edge of the pulse that intersects the threshold is approximately linear.

The assumption that the pulses have the same shape may not be valid. For example, the pulses may include a fast component and a slow component, and the ratio between the fast component and the slow component may vary from pulse to pulse. This variation for the ratio between the fast and slow components may occur for several reasons. A couple of non-limiting examples in which the pulse shape is determined by varying amounts of fast components and slow components is discussed herein with reference to FIGS. 10A-E and FIGS. 11A-H.

Figure 4A:
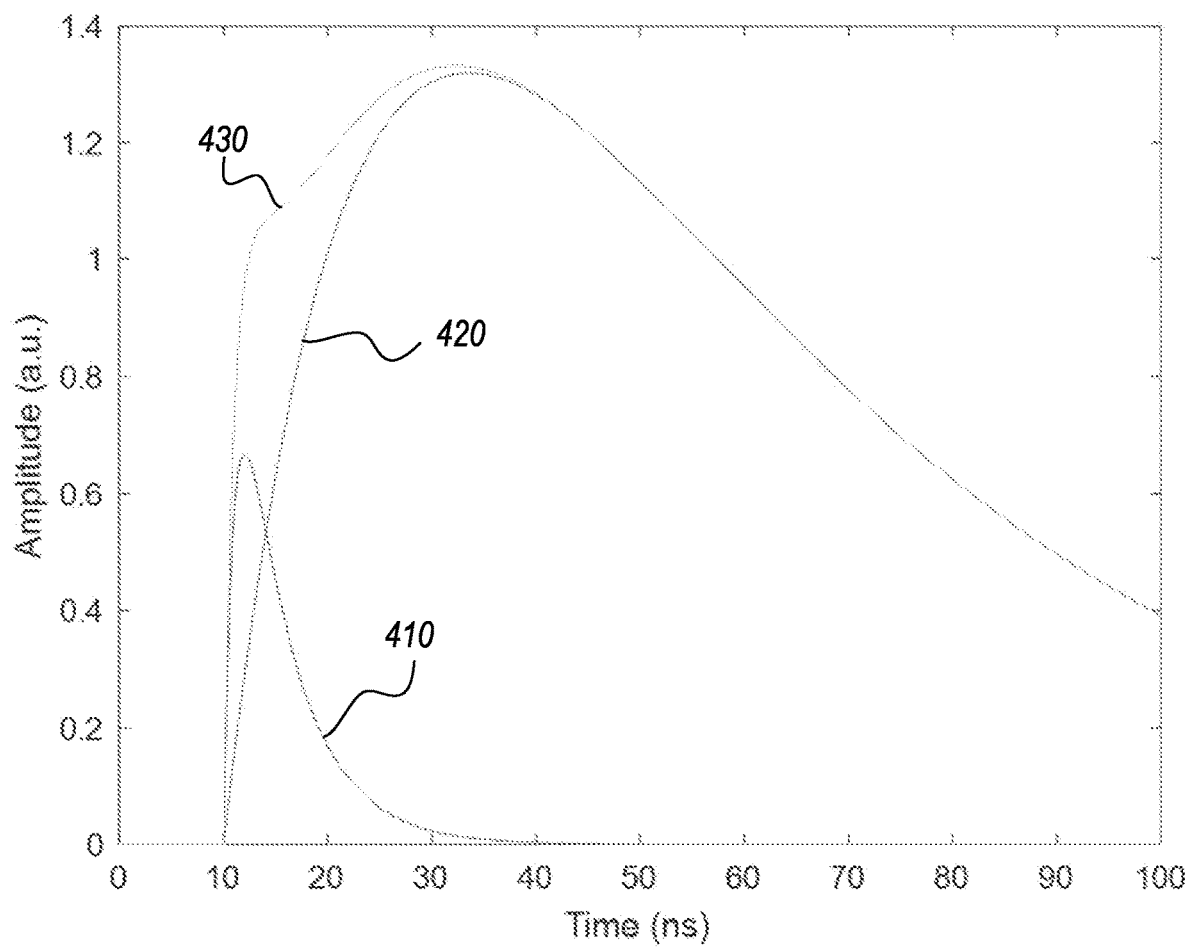
FIG. 4A illustrates pulse shape having a fast component and a slow component, according to one embodiment.

FIG. 4A illustrates a first example of a total pulse 430 that includes both a fast component 410 and a slow component 420. The total pulse 430 is the sum of the fast component 410 and the slow component 420. In the example of FIG. 4A, 5% of the energy of the total pulse 430 is due to the fast component 410 and 95% of the energy is due to the slow component 420.

Figure 4B:
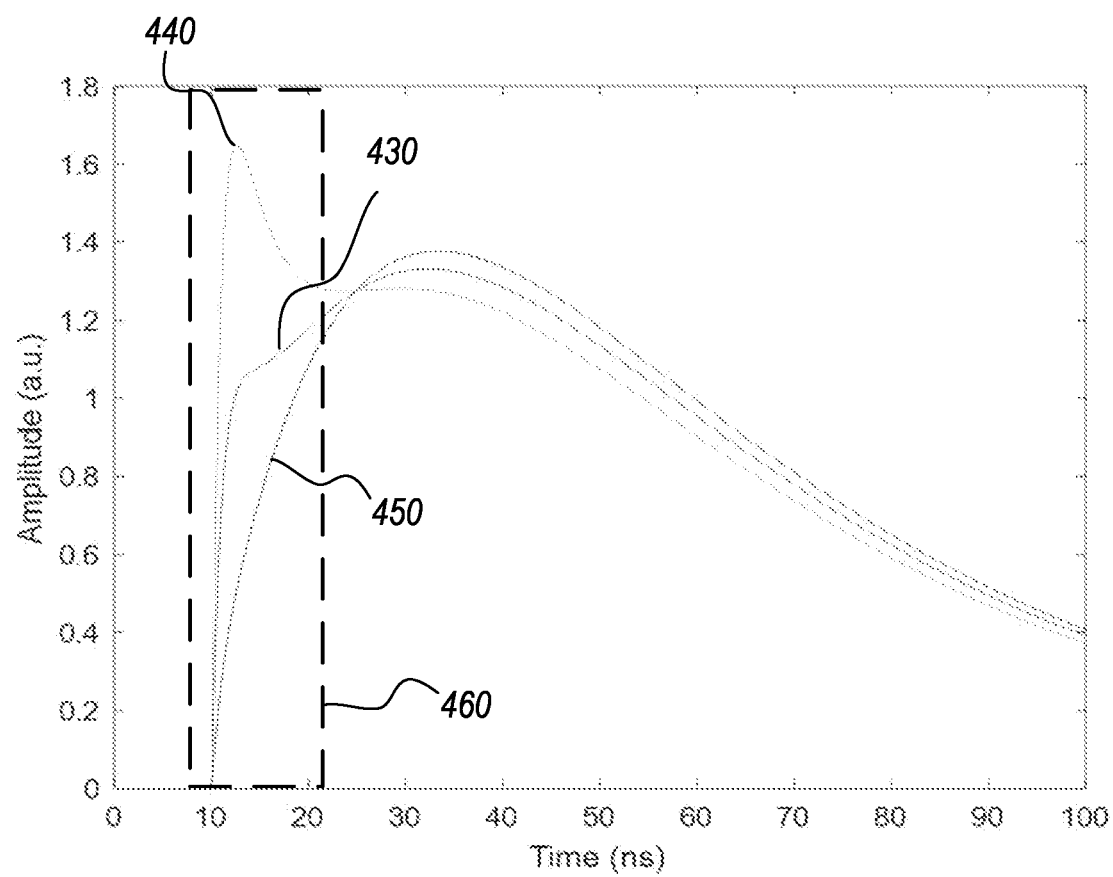
FIG. 4B illustrates three pulse shapes having different ratios between the fast component and the slow component, according to one embodiment.

FIG. 4B compares the first pulse 430 with a second pulse 440 and a third pulse 450. All three pulses have the same total energy, but the ratio of the amount of fast component 410 to slow component 420 is different for each of the three pulses. In the second pulse 440, 10% of the energy is due to the fast component 410 and 90% of the energy is due to the slow component 420. In the third pulse 450, 1% of the energy is due to the fast component 410 and 99% of the energy is due to the slow component 420.

Figure 4C:
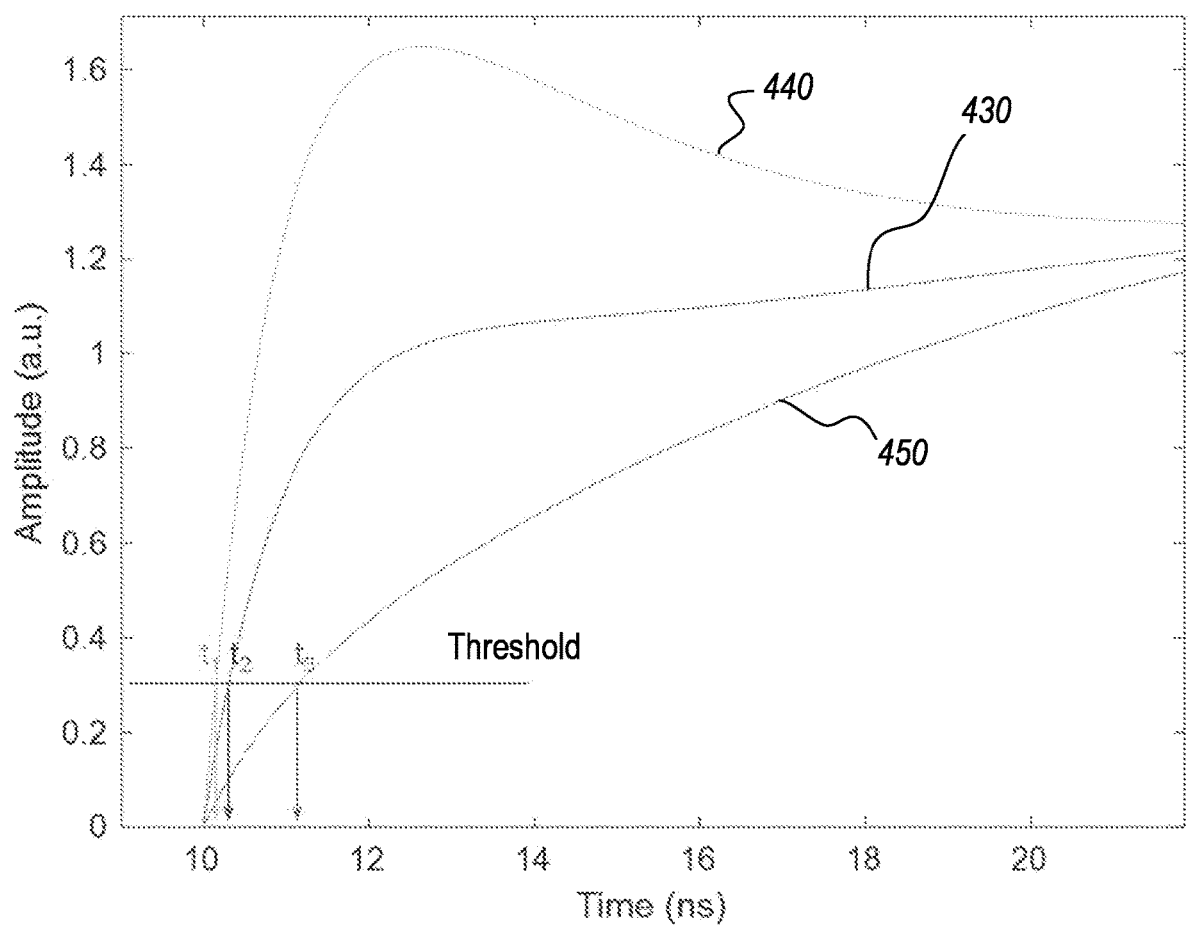
FIG. 4C illustrates time walk among the three pulse shapes in FIG. 4B, according to one embodiment.

FIG. 4C zooms into the region 460 from FIG. 4B. The threshold for time detection is set to a value of 0.3, resulting in the detection time for the second pulse 440 being t1=10.2; the detection time for the second pulse 440 being t2=10.4 the detection time for the second pulse 440 being t3=11.3. Even though all three pulses have the same energy, they each have a different time walk because the ratio of fast and slow components is different among the three pulses. Thus, in the case of pulse shapes having different ratios between the fast and slow components, a time-walk correction function based on a single energy measurement is not sufficient to accurately correct for time walk.

In view of the above issue, the methods described herein use multiple energy measurements for each pulse (e.g., by integrating different portions of the energy), and parameterize the time-walk correction function based on these multiple energy measurements. That is, the pulse can be divided into multiple parts, each part representing a different ratio of between the contributions of the fast and slow components. This division of the pulse into parts can be in the time domain, frequency domain, or both in the time domain and frequency domain. In the time domain, for example, a time window near the leading end of the pulse can represent more of the fast component, whereas a time window near the falling end of the pulse can represent more of the slow component. In the frequency domain, for example, a high-pass filter can transmit more of the fast component, whereas a low-pass filter can transmit more of the slow component. Additionally, the time and frequency domain approaches can be combined to provide energy charge measurements of respective parts of the pulse representing differing amounts/ratios between the slow and fast components.

Figure 4D:
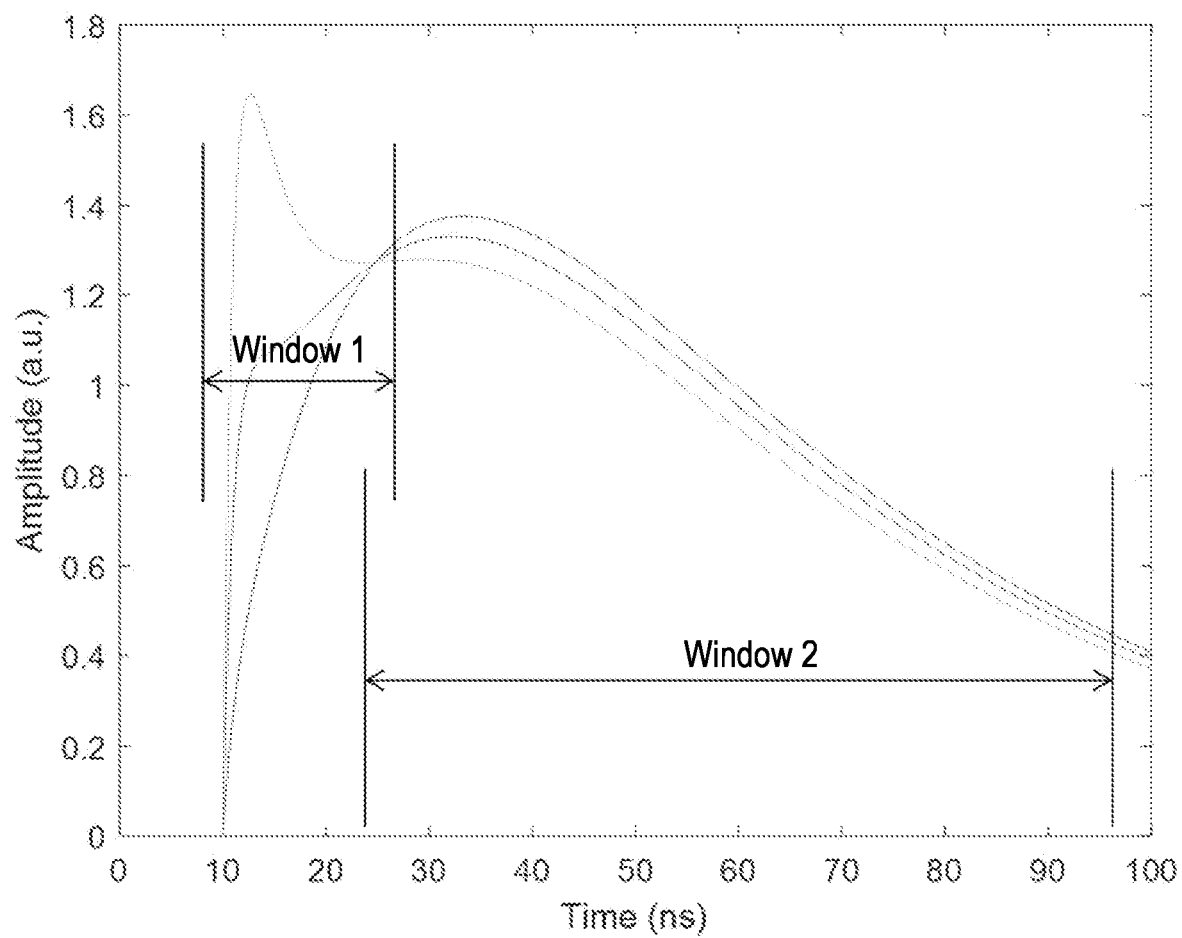
FIG. 4D illustrates multiple windows used to measure the integrated charge for the pulse shapes, according to one embodiment.
Figure 5A:
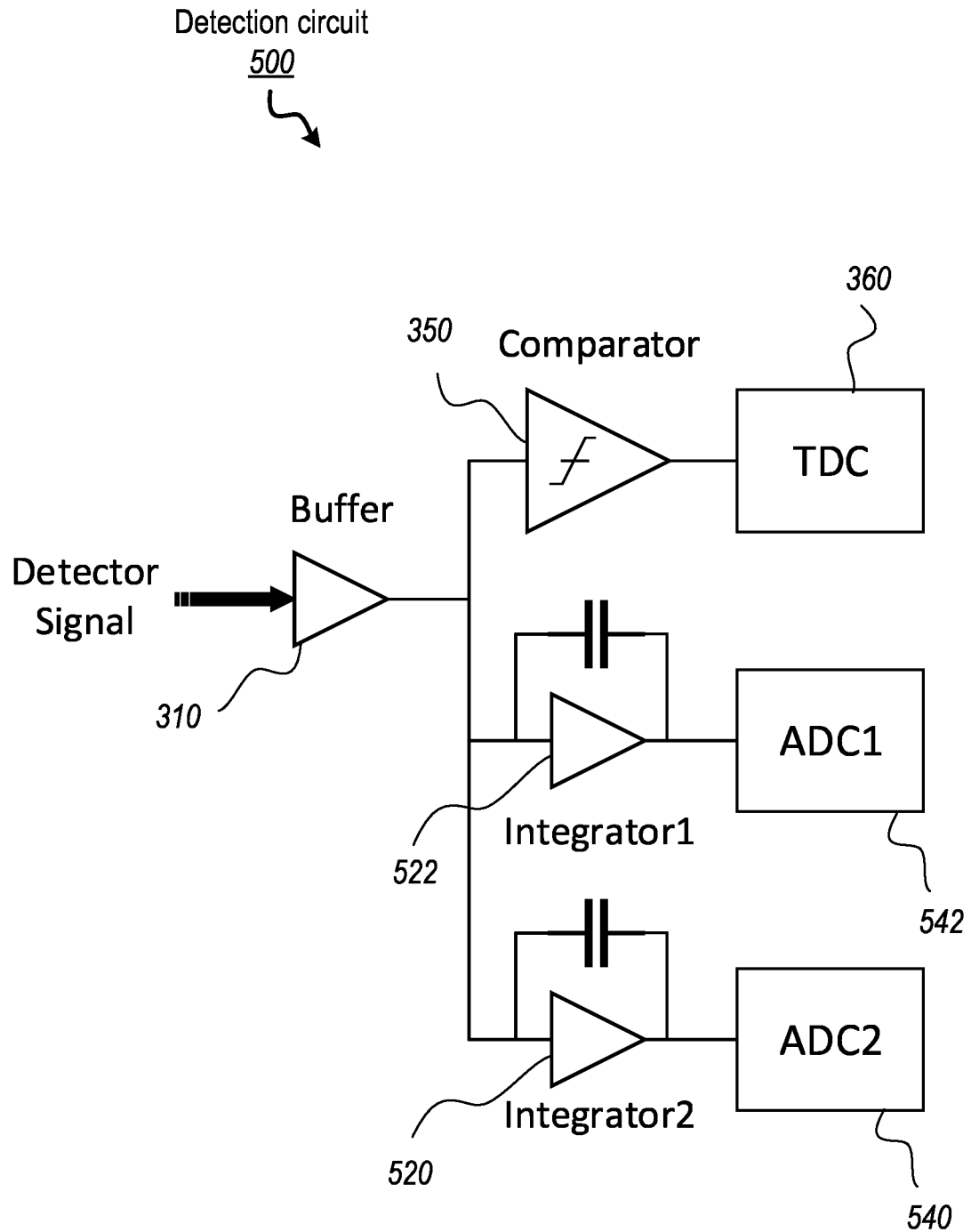
FIG. 5A illustrates a schematic diagram of a circuit measuring time and integrated charge for two integration windows, according to one embodiment.

FIG. 5A shows a first nonlimiting embodiment of a detection circuit 500 that includes two integrators: a first integrator 522 and a second integrator 520. The detection circuit 500 further includes two ADCs: a first ADC 542 and a second ADC 540. The two integrators and ADCs are used to measure the signal charge accumulated in two different windows. FIG. 4D illustrates measuring the accumulated energy over two windows: a first time window (i.e., window 1): and a second time window (i.e., window 2). The two windows provide complementary information. In the example of FIG. 4D, window 1 represents more of the fast component and window 2 represents more of the slow component.

The two windows can overlap in certain implementations and not overlap in other implementations. The mean time for the two windows can be different. The two windows can be staggered, such that at least one of the windows includes a period absent from the other window. Additionally or alternatively, the two windows can start at the same time and end at different times. The respective windows can use window-ing functions. Additionally or alternatively, the two windows may be side-by-side, or may be separated in time. In each of these nonlimiting examples, the two windows provide complementary information, such that each window captures some information that is unique from that captured by the other window(s).

For example, in FIG. 4D the windows are represented as rectangular window functions, but other window functions can used, such as a Blackman-Harris window, a Hann window, a Hamming window, a Blackman window, a Nuttall window, a Blackman-Nuttall window, a Blackman-Harris window, a Flat top window, a Rife-Vincent window, a Gaussian window, a Tukey window, a Planck-taper window, a Kaiser window, a Dolph-Chebyshev window, a Bartlett-Hann window, and a Planck-Bessel window.

Using multiple windows results in multiple accumulated charge/energy values (e.g., E1 and E2 corresponding respectively to ADC1 542 and ADC2 540). In certain embodiments, these accumulated charges E1 and E2 can be thought of as corresponding to fast and slow components. The walk correction function $f(E1,E2)$ can then be expressed as a function of both E1 and E2, and the corrected time is given by $$t' = t - f(E1, E2),$$

wherein $f$ is a joint function that depends on both E1 and E2. In certain embodiments in which the pulse has a linear leading edge, the walk correction function $f(E1,E2)$ can then be expressed as $$f(E1, E2) = 1/(\alpha E1 + \beta E2 + \gamma)$$

wherein, $\alpha$, $\beta$ and $\gamma$ are parameters determined via curve fitting. Additionally or alternatively, the walk correction function $f(E1,E2)$ could be further factorized into a sum or product of two functions each function respectively depending only on E1 or E2 (e.g., the two functions would be $f1(E1)$ and $f2(E2)$), respectively. That is, the walk correction function $f(E1,E2)$ could be further factorized as $f(E1, E2)=f1(E1)+f2(E2)$ or as $f(E1,E2)=f1(E1)\times f2(E2)$.

Figure 5B:
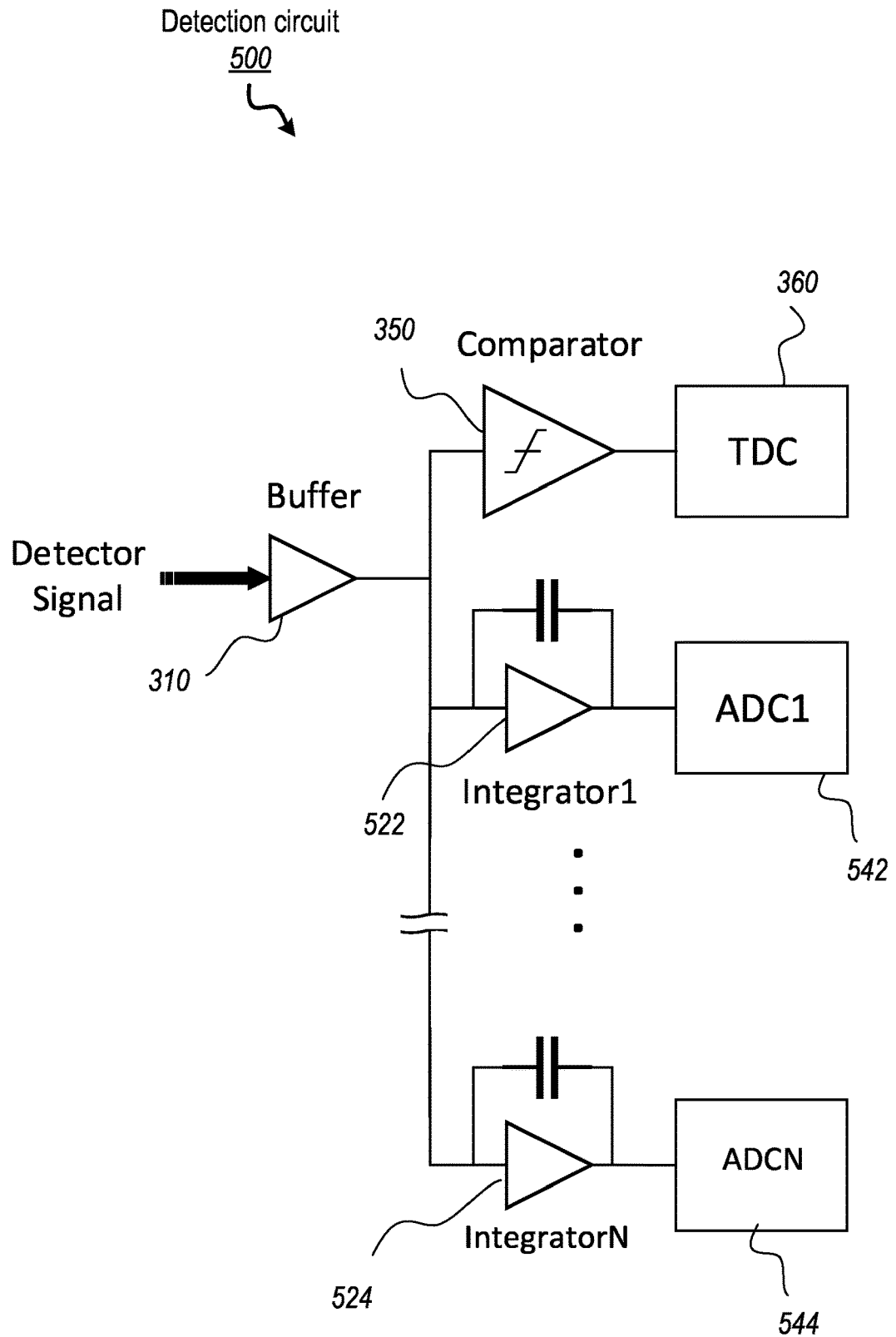
FIG. 5B illustrates an alternative schematic diagram of a circuit measuring time and integrated charge for N integration windows, according to one embodiment.

FIG. 5B shows an alternative schematic of the detection circuit 500 with N windows, rather than two windows. detection circuit 500 further includes N ADCs, of which are illustrate a first ADC 542, a second ADC 540, and an Nth ADC 544.

Figure 6A:
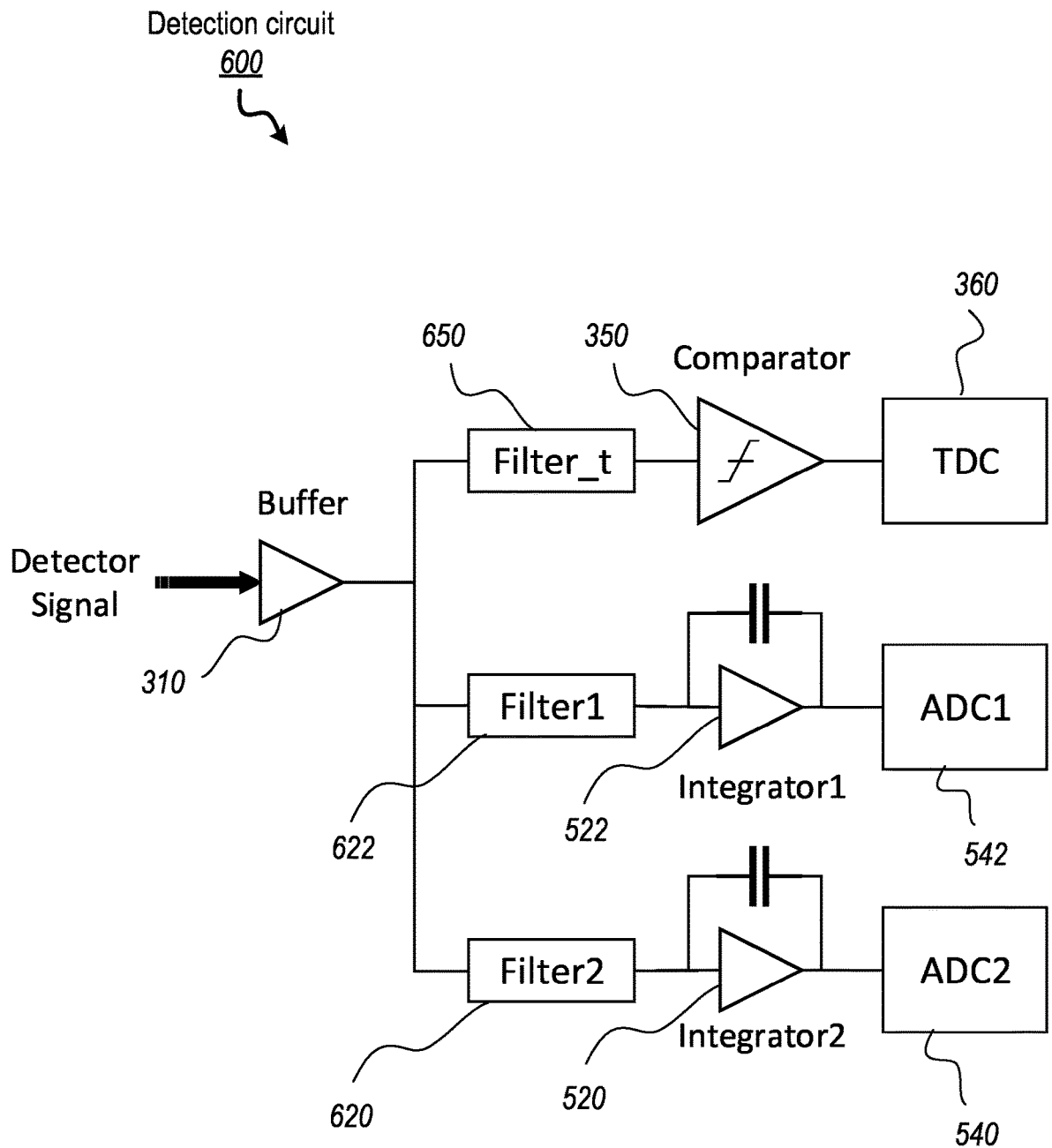
FIG. 6A illustrates a schematic diagram of a circuit having filters before the time and charge integration circuits, according to one embodiment.

FIG. 6A illustrates a second non-limiting embodiment, in which an alternative architecture 600 is used for the detection circuit. In detection circuit 600, filters 620, 622, and 650 are provided between the buffer amplifier 310 and the comparator and integrators. The filters 620, 622, and 650 can help to improve the accuracy for determining the charge associated with the fast and slow components. The respective filters may be a low-pass filter, a high-pass filter, a band-pass filter, or a combination thereof. For example, a low-pass filter before the ADC measuring the slow component can be used to reduce the contribution arising from the fast component. Similarly, a high-pass filter before the ADC measuring the fast component can be used to reduce the contribution arising from the slow component. Using filters to respectively select the slow and fast components reduces the need for different filter windows. For example, the windows may be the same for the integrated signals measured by ADC1 542 and ADC2 540 because the filters 620 and 622 have already performed the function of selecting for the slow and fast components, respectively. For example, filter1 622 can use a high-pass filter or a band-pass filter to preferentially transmit the fast component, while some residual slow component may also be transmitted through filter1 622. Similarly, filter2 620 can use a low-pass filter or a band-pass filter to preferentially transmit the slow component, while some residual fast component may also be transmitted through filter2 620. As long as the ADCs 540 and 542 are used to obtain signals with different ratios between the fast and slow components, the signals from ADCs 540 and 542 can be used to determine a time-walk correction that accounts for variations in the ratio between the fast and slow components.

Although the embodiments are illustrated using the non-limiting example with two ADCs and two values E1 and E2 for the accumulated charge, more ADCs and more values for the accumulated charge (e.g., N values E1, E2, . . . , EN) can be used for determining the time-walk correction.

Figure 6B:
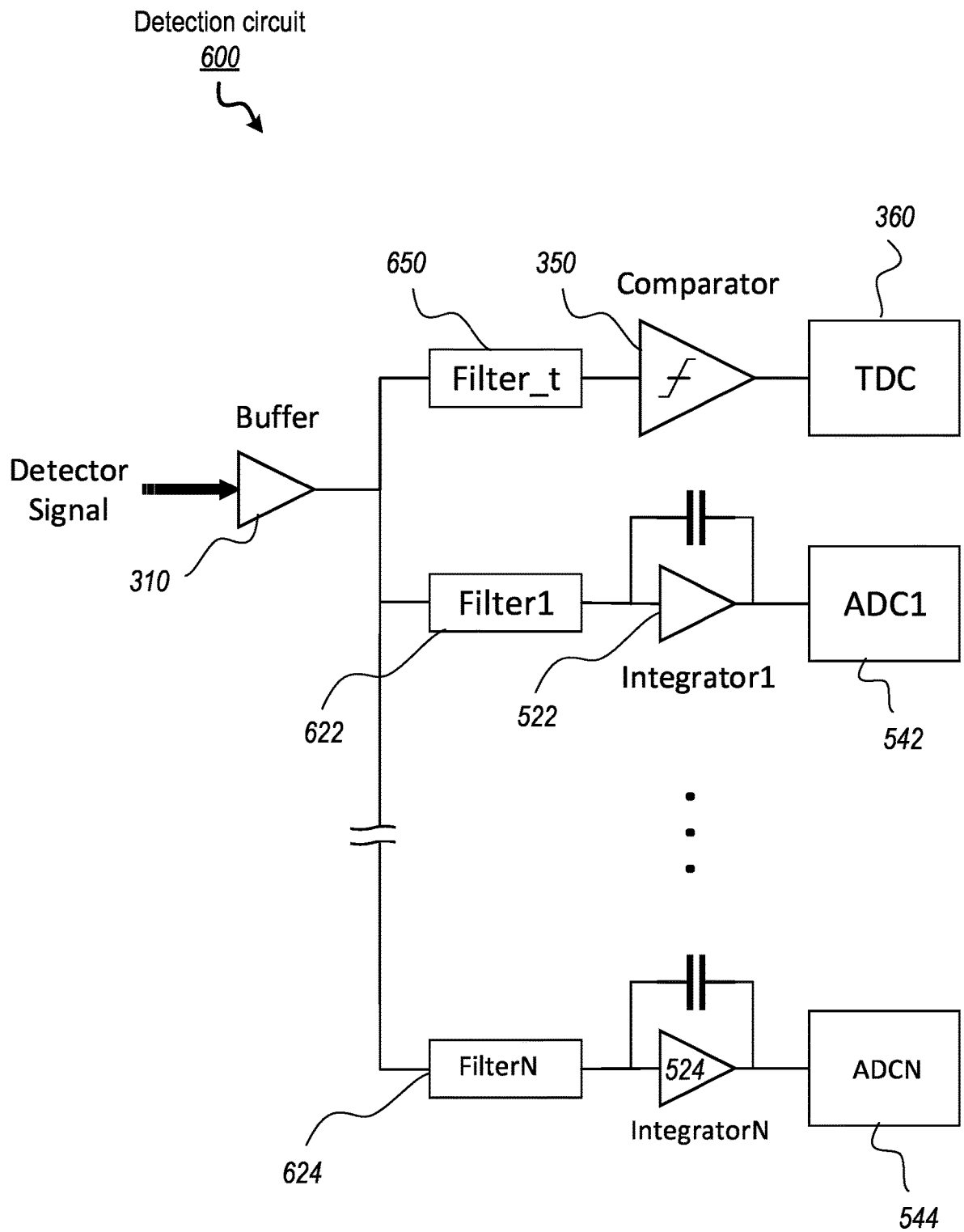
FIG. 6B illustrates an alternative schematic diagram of a circuit having filters before the time and the N charge integration circuits, according to one embodiment.

FIG. 6B illustrates another embodiment of architecture 600 having N integration windows. In detection circuit 600, filters 622, 624, and 650 are provided between the buffer amplifier 310 and the comparator and integrators.

Figure 7A:
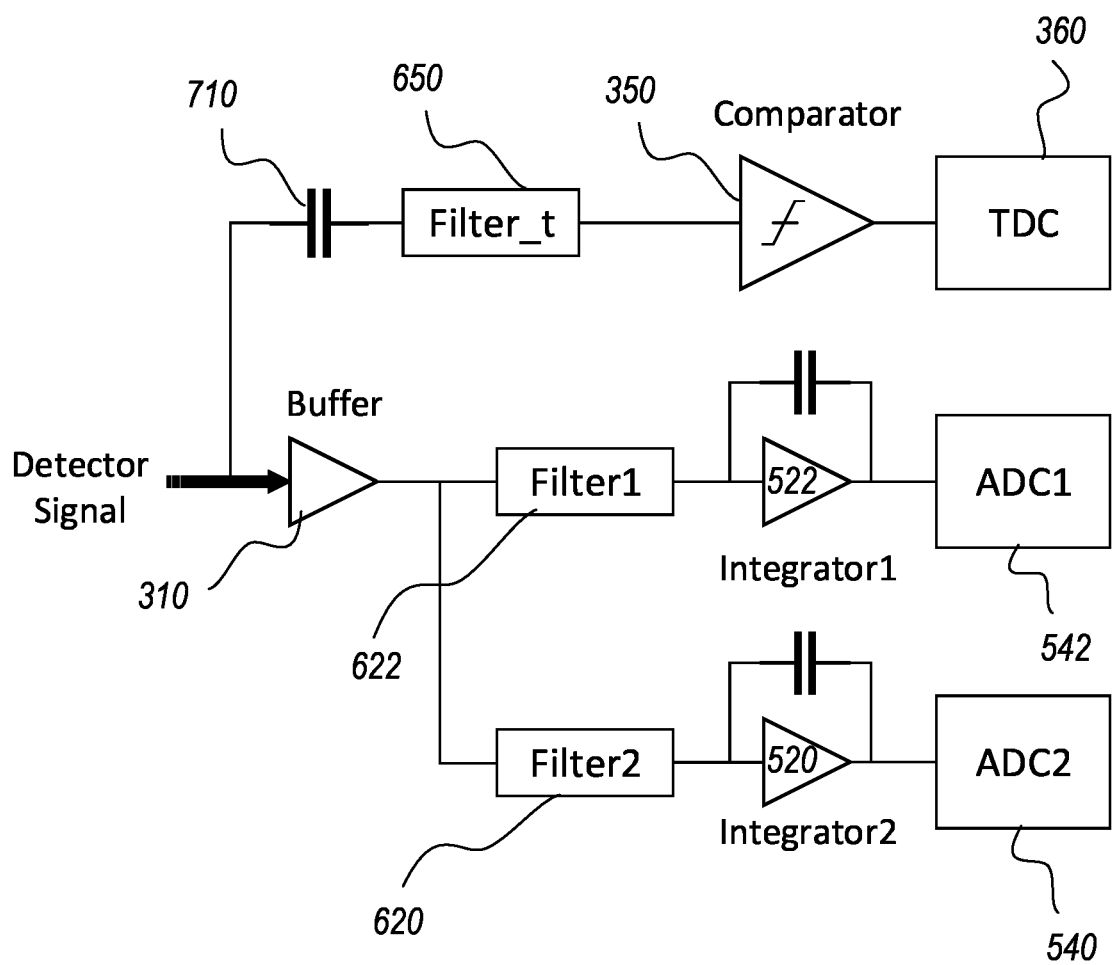
FIG. 7A illustrates a schematic diagram of a circuit in which the time measurement circuit is AC-coupled to the detector signal upstream from a buffer amplifier, according to one embodiment.

FIG. 7A illustrates a third non-limiting embodiment, in which another architecture 700 is used for the detection circuit. In detection circuit 700, the timing channel fans out before the buffer amplifier 310, and the timing channel is AC coupled via capacitor 710 to the photodetector signal. That is, the timing channel does not use the signal fanned out by the buffer amplifier 310. Instead, the timing channel directly taps the detector signal with AC coupling (e.g., simply with a capacitor).

Figure 7B:
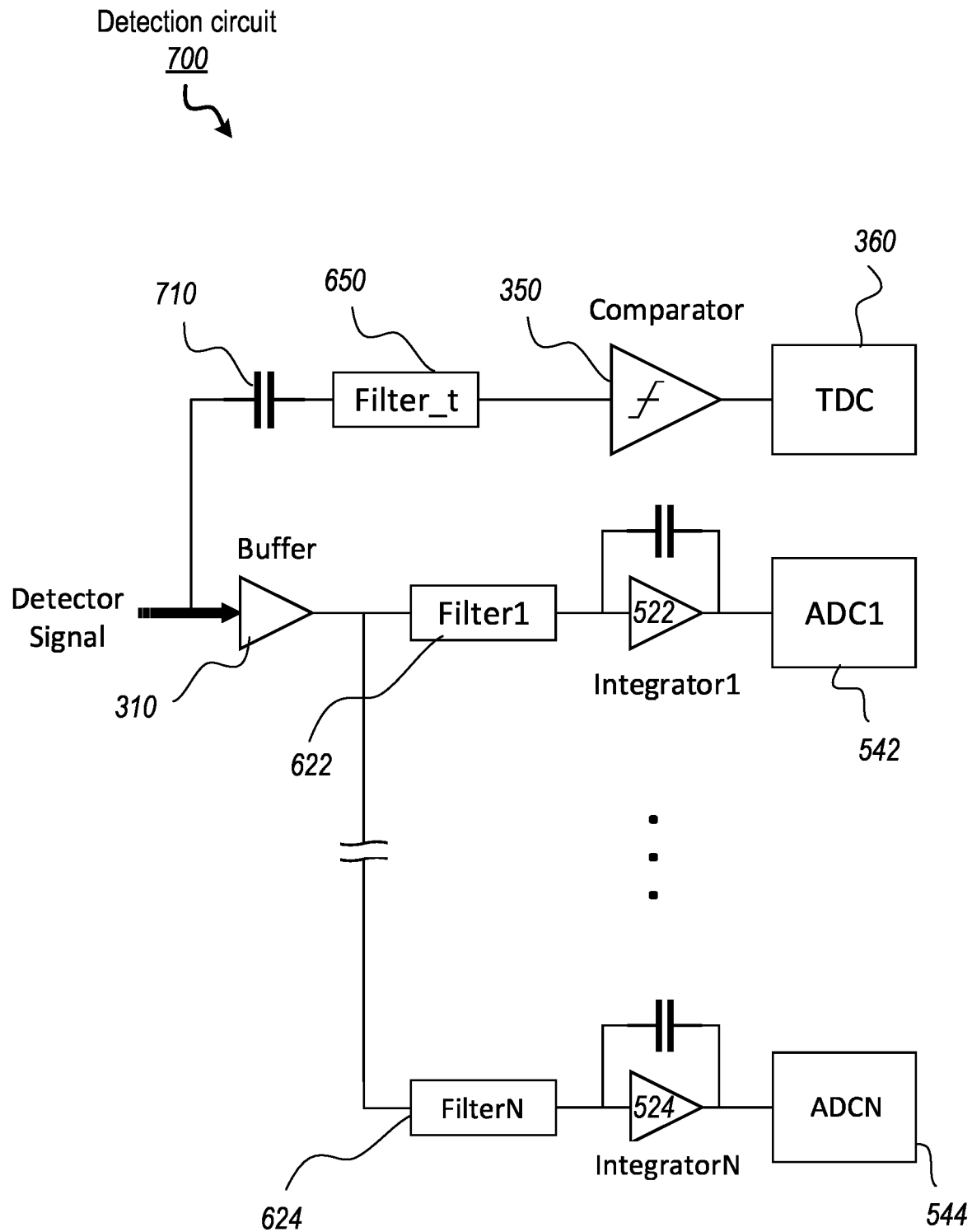
FIG. 7B illustrates an alternative schematic diagram of a circuit in which the time measurement circuit is AC-coupled to the detector signal upstream from a buffer amplifier and having N charge integration circuits, according to one embodiment.

FIG. 7B illustrates another embodiment of architecture 700 having N windows to discriminate among slow and fast response components.

Figure 8:
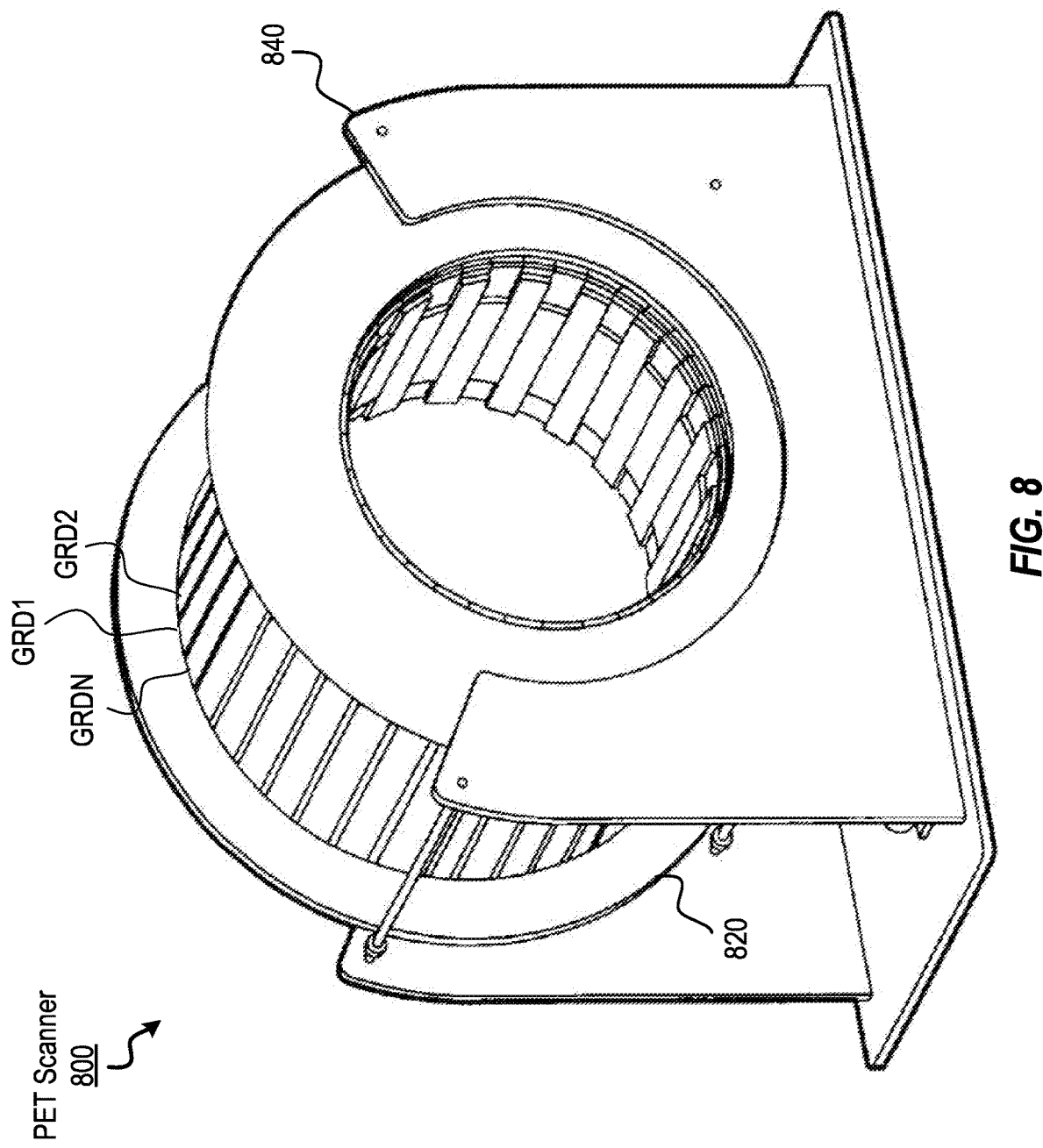
FIG. 8 illustrates a perspective view of a PET scanner, according to one embodiment.
Figure 9:
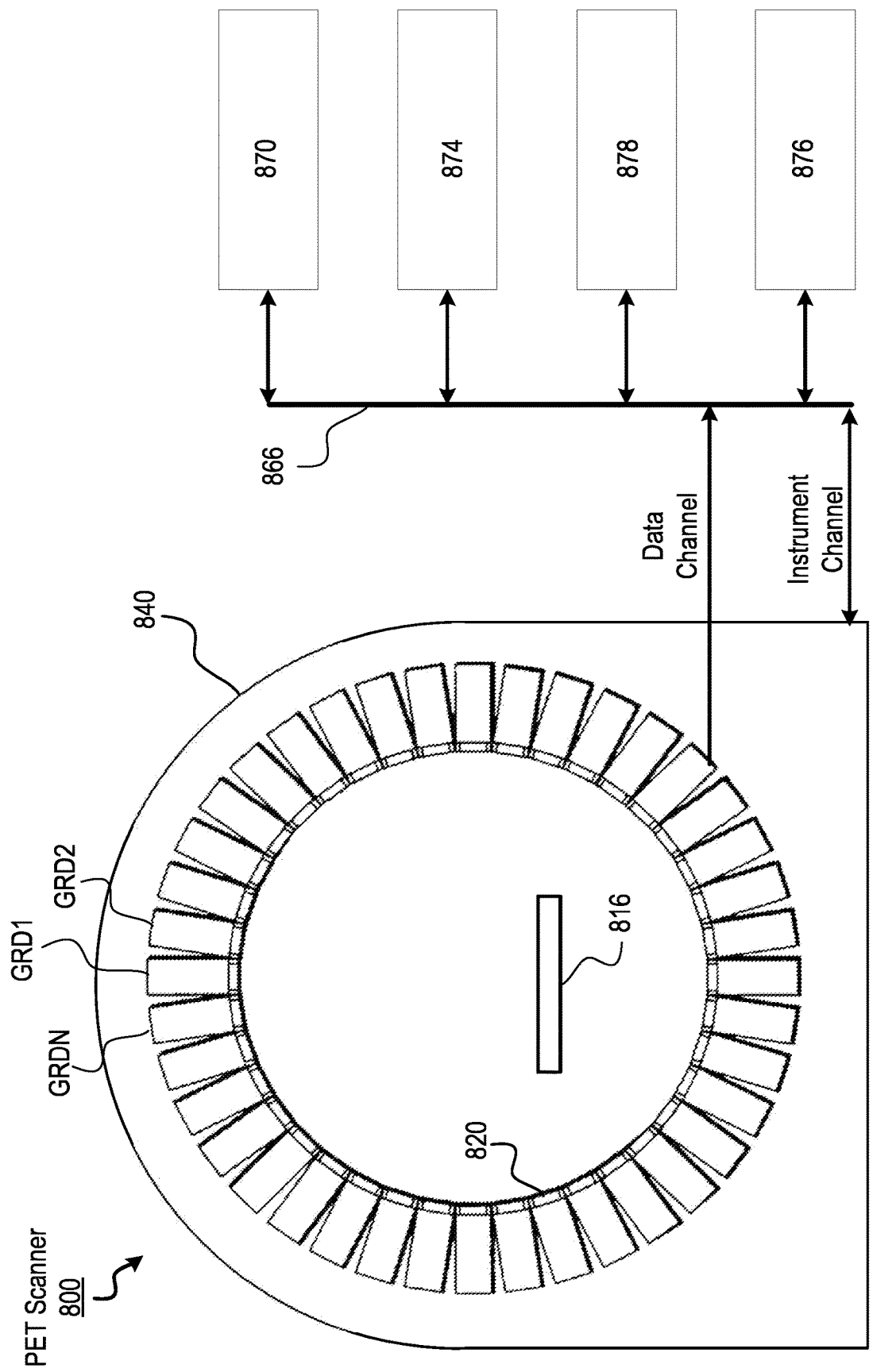
FIG. 9 illustrates a schematic of a PET scanner, according to one embodiment.

FIGS. 8 and 9 show a non-limiting example of a PET scanner 800 that can implement the method 700. The PET scanner 800 includes gamma-ray detectors (GRDs) (e.g., GRD1, GRD2, through GRDN) that are each configured as rectangular detector modules.

Each GRD can include a two-dimensional array of individual detector crystals, which absorb gamma radiation and emit scintillation photons. The scintillation photons can be detected by a two-dimensional array of photomultiplier tubes (PMTs) that are also arranged in the GRD. A light guide can be disposed between the array of detector crystals and the PMTs.

Alternatively, the scintillation photons can be detected by an array of silicon photomultipliers (SiPMs), and each individual detector crystals can have a respective SiPM. Each photodetector (e.g., PMT or SiPM) can produce an analog signal that indicates when scintillation events occur, and an energy of the gamma ray producing the detection event. Moreover, the photons emitted from one detector crystal can be detected by more than one photodetector, and, based on the analog signal produced at each photodetector, the detector crystal corresponding to the detection event can be determined using Anger logic and crystal decoding, for example.

FIG. 9 shows a schematic view of the PET scanner system 800 having gamma-ray detectors (GRDs) (gamma-ray) photon counting arranged to detect gamma-rays emitted from a patient. The GRDs can measure the timing position, and energy corresponding to each gamma-ray detection. In one implementation, the gamma-ray detectors are arranged in a ring, as shown in FIGS. 8 and 9. The detector crystals can be scintillator crystals, which have individual scintillator elements arranged in a two-dimensional array and the scintillator elements can be any known scintillating material. The PMTs can be arranged such that light from each scintillator element is detected by multiple PMTs to enable Anger arithmetic and crystal decoding of scintillation event.

FIG. 9 shows an example of the arrangement of the PET scanner 800, in which the patient to be imaged rests on a table 816 and the GRD modules GRD1 through GRDN are arranged circumferentially around the patient and the table 816. The GRDs can be rigidly connected to a circular component 820 that is movably connected to the gantry 840. The gantry 840 houses many parts of the PET imager. The gantry 840 of the PET imager also includes an open aperture through which the patient and the table 816 can pass, and gamma-rays emitted in opposite directions from the patient due to an annihilation event can be detected by the GRDs and timing and energy information can be used to determine coincidences for gamma-ray pairs.

In FIG. 9, circuitry and hardware are also shown for acquiring, storing, processing, and distributing gamma-ray detection data. The circuitry and hardware include: a processor 870, a network controller 874, a memory 878, and a data acquisition system (DAS) 876. The PET imager also includes a data channel that routes detection measurement results from the GRDs to the DAS 876, processor 870, memory 878, and network controller 874. The data acquisition system 876 can control the acquisition, digitization, and routing of the detection data from the detectors. In one implementation, the DAS 876 controls the movement of the bed 816. The processor 870 performs functions including reconstructing images from the detection data, pre-reconstruction processing of the detection data, and post-reconstruction processing of the image data.

The processor 870 can be configured to perform various steps of an image reconstruction method. The processor 870 can include a CPU that can be implemented as discrete logic gates, as an Application Specific Integrated Circuit (ASIC), a Field Programmable Gate Array (FPGA) or other Complex Programmable Logic Device (CPLD). An FPGA or CPLD implementation can be coded in VHDL, Verilog, or any other hardware description language and the code can be stored in an electronic memory directly within the FPGA or CPLD, or as a separate electronic memory. Further, the memory can be non-volatile, such as ROM, EPROM, EEPROM or FLASH memory. The memory can also be volatile, such as static or dynamic RAM, and a processor, such as a microcontroller or microprocessor, can be provided to manage the electronic memory as well as the interaction between the FPGA or CPLD and the memory.

Alternatively, the CPU in the processor 870 can execute a computer program, the program being stored in any of the above-described non-transitory electronic memories and/or a hard disk drive, CD, DVD, FLASH drive or any other known storage media. Further, the computer-readable instructions can be provided as a utility application, background daemon, or component of an operating system, or combination thereof, executing in conjunction with a processor, such as a Xenon processor from Intel of America or an Opteron processor from AMD of America and an operating system, such as Microsoft VISTA, UNIX, Solaris, LINUX, Apple, MAC-OS and other operating systems known to those skilled in the art. Further, CPU can be implemented as multiple processors cooperatively working in parallel to perform the instructions.

The memory 878 can be a hard disk drive, CD-ROM drive, DVD drive, FLASH drive, RAM, ROM or any other electronic storage known in the art.

The network controller 874, such as an Intel Ethernet PRO network interface card from Intel Corporation of America, can interface between the various parts of the PET imager. Additionally, the network controller 874 can also interface with an external network. As can be appreciated, the external network can be a public network, such as the Internet, or a private network such as an LAN or WAN network, or any combination thereof and can also include PSTN or ISDN sub-networks. The external network can also be wired, such as an Ethernet network, or can be wireless such as a cellular network including EDGE, 3G and 4G wireless cellular systems. The wireless network can also be WiFi, Bluetooth, or any other wireless form of communication that is known.

FIGS. 10A-F illustrate a non-limiting example of detector dynamics giving rise to variations in the ratio between fast and slow components. Here, hybrid detectors use both Cherenkov light and scintillation light to generate an electrical pulse representing a detection event. Cherenkov light corresponds to a fast component and scintillation light corresponds to a slow component. Cherenkov light is generated when a particle travels through a given medium faster than the phase velocity of light in the given medium. For energized electrons in a scintillator, there is an energy threshold (i.e., velocity) above which an energized electron emits Cherenkov light. The process of emitting Cherenkov light reduces the energized electron's energy and speed until the energized electron falls below the energy threshold, after which the energized electron generates only scintillation light.

Figure 10A:
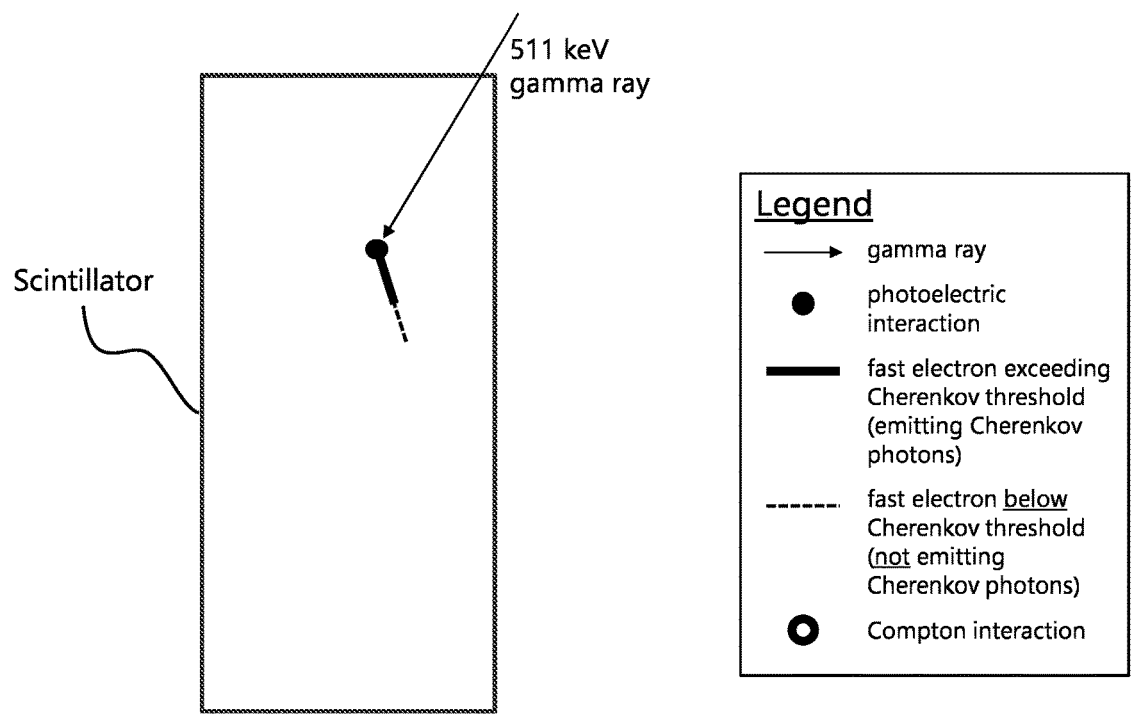
FIG. 10A illustrates a detection event in a hybrid detector using both Cerenkov and scintillation light, the detection event includes only a photoelectric interaction, according to one embodiment.
Figure 10B:
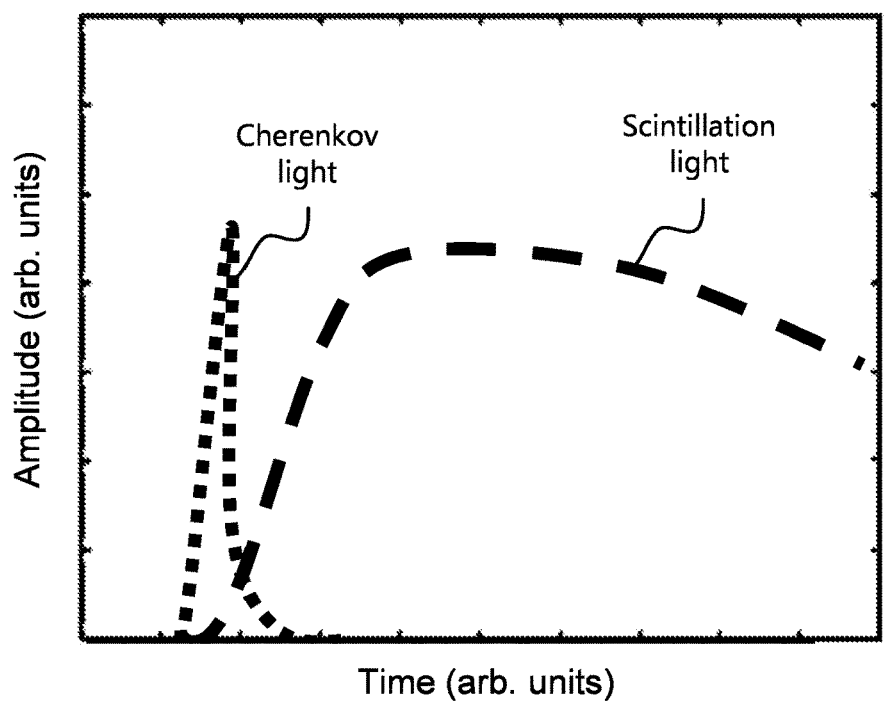
FIG. 10B illustrates a time plot of signals due to the Cerenkov light and scintillation light arising from the detection event in FIG. 10A, according to one embodiment.

As shown in FIG. 10A a 511 keV gamma ray can give rise to a 511 keV energized electron resulting in the energized electron generating a maximum amount of Cherenkov light before falling below the energy threshold. FIG. 10B illustrates the relative amounts of Cherenkov light and scintillation light generated for the detection case illustrated in FIG. 10A.

Figure 10C:
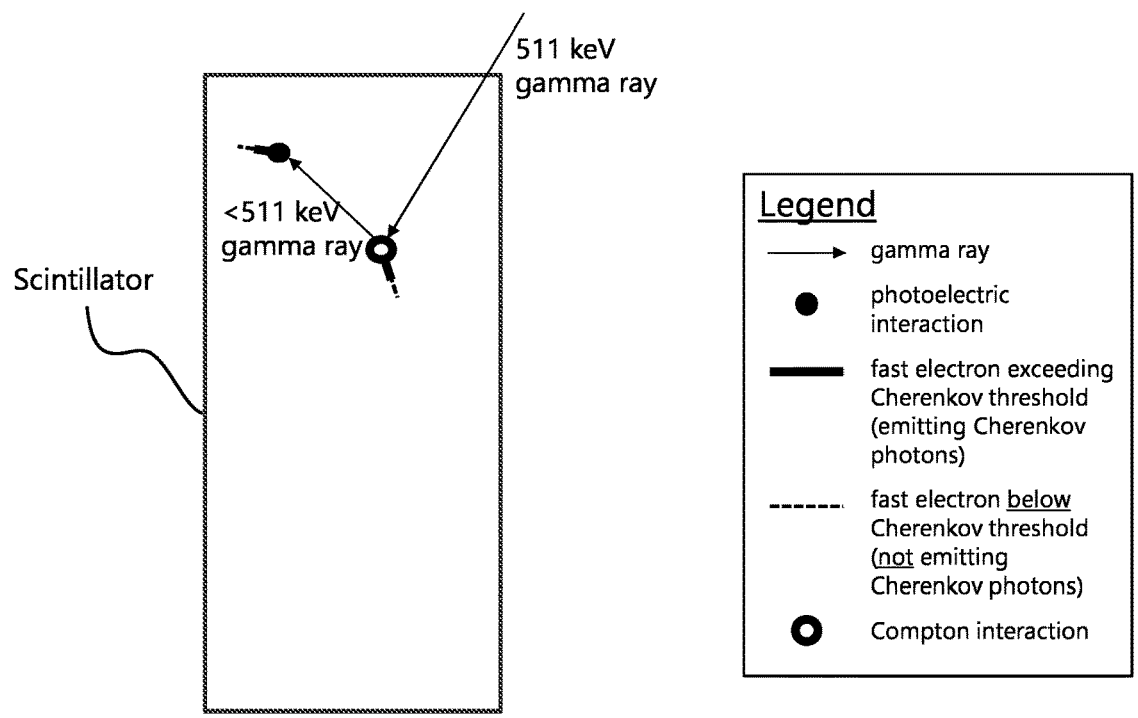
FIG. 10C illustrates a detection event in a hybrid detector using both Cerenkov and scintillation light, the detection event includes one Compton interaction and one photoelectric interaction, according to one embodiment.
Figure 10D:
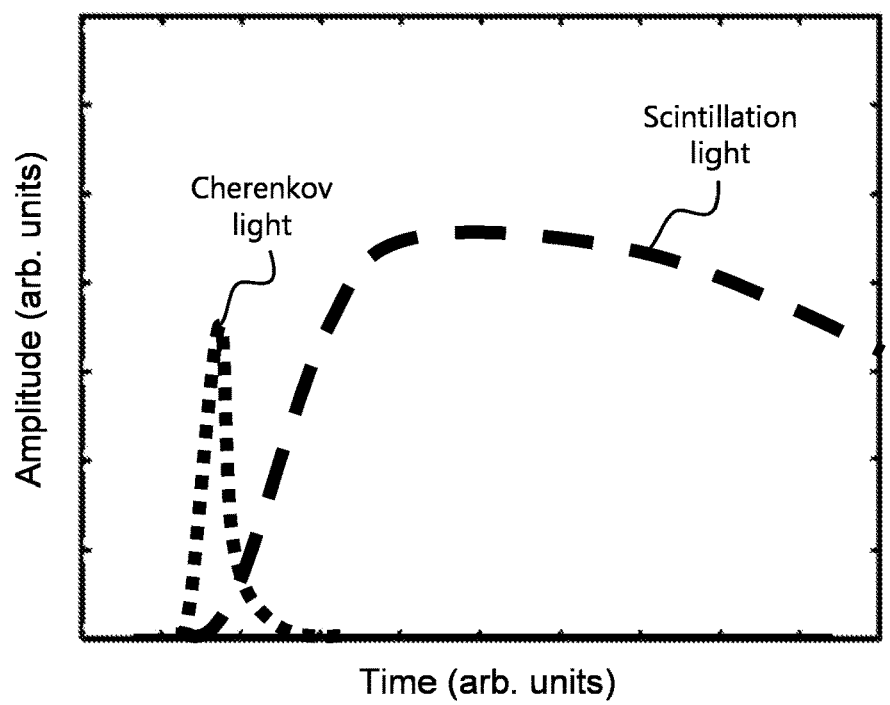
FIG. 10D illustrates a time plot of signals due to the Cerenkov light and scintillation light arising from the detection event in FIG. 10C, according to one embodiment.

In FIG. 10C, Compton scatting result in two energized electrons both with energies below 511 keV (i.e., due to conservation of energy, the sum of their energies will be 511 keV). Each of these two energized electrons emits some Cherenkov light before falling below the energy threshold. But the total amount of Cherenkov light is less than in FIG. 10A because the original energy of each of these two energized electrons is closer to the energy threshold. FIG. 10D illustrates the relative amounts of Cherenkov light and scintillation light generated for the detection case illustrated in FIG. 10C.

Figure 10E:
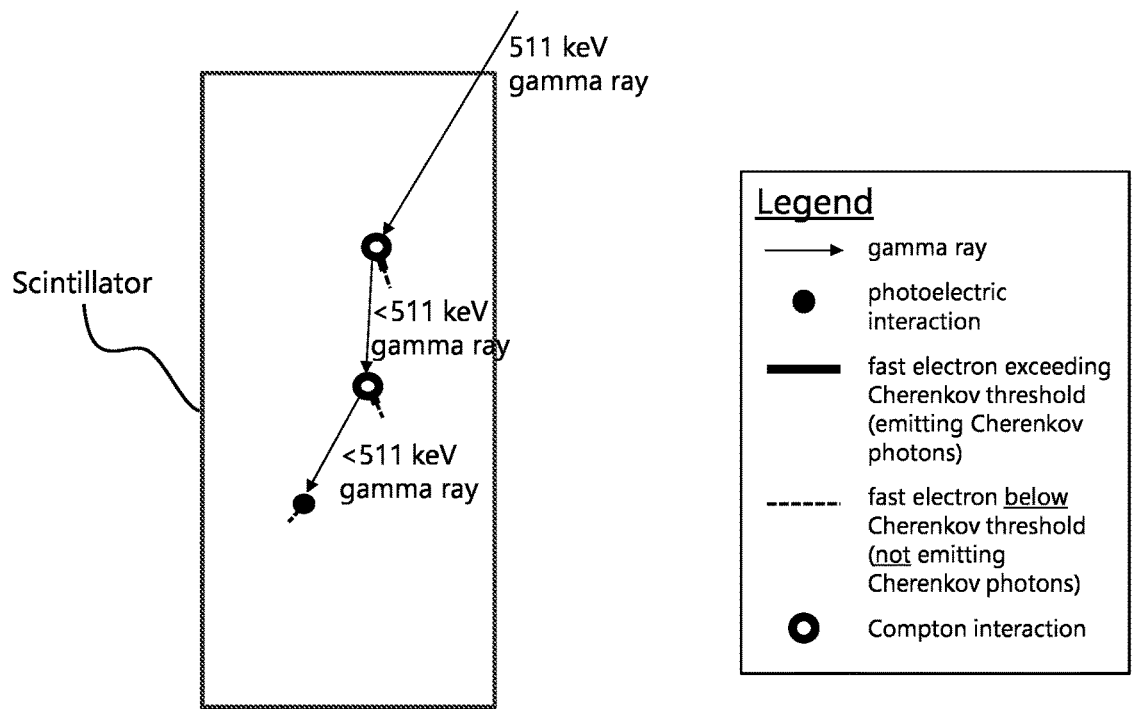
FIG. 10E illustrates a detection event in a hybrid detector, the detection event includes two Compton interactions and one photoelectric interaction, according to one embodiment.
Figure 10F:
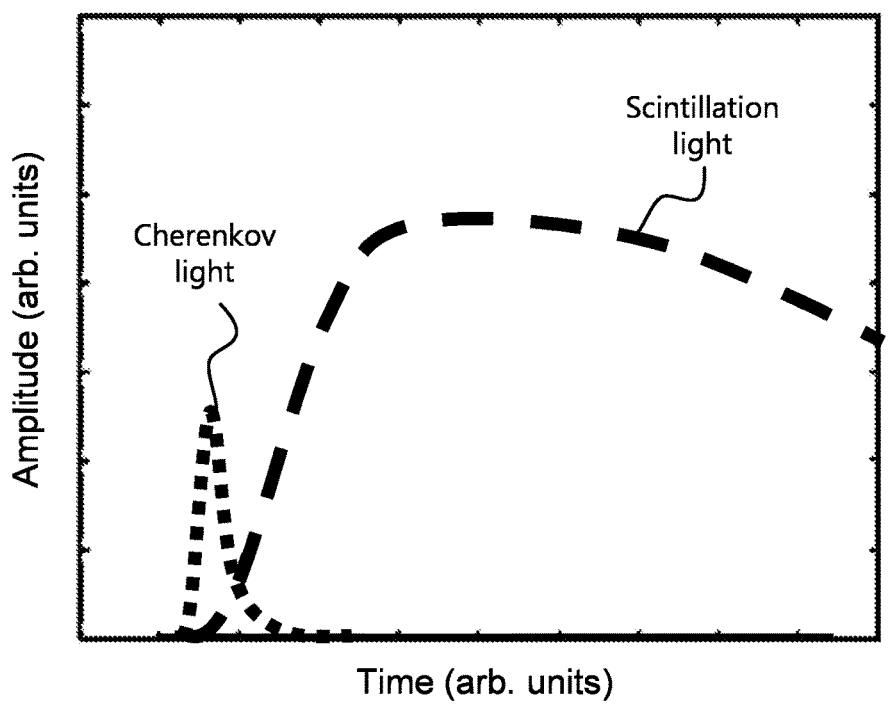
FIG. 10F illustrates a time plot of signals due to the Cerenkov light and scintillation light arising from the detection event in FIG. 10E, according to one embodiment.

In FIG. 10E, Compton scatting result in three energized electrons. The total Cherenkov light emitted in this case is even less than in FIG. 10C because the initial energies of the energized electrons are even closer to or even below the energy threshold for Cherenkov light. FIG. 10F illustrates the relative amounts of Cherenkov light and scintillation light generated for the detection case illustrated in FIG. 10E.

As discussed above, in hybrid Cherenkov detectors, both Cherenkov and scintillation photons are detected. Cherenkov light is emitted when an electron is traveling through a medium at a speed that is greater than the phase velocity of light in the medium (i.e., the phase velocity is c/n, with c being the speed of light in vacuum and n being the index of refraction). This requirement sets a minimum kinetic energy for an electron to emit Cherenkov radiation. That is, to emit Cherenkov radiation, the electron must receive enough energy from the incident gamma ray to exceed the threshold energy, and emission of Cherenkov radiation will cease as the electron loses energy from scattering in the material resulting in its kinetic energy falling below the energy threshold. Cherenkov light is emitted in an extremely short time burst, which is beneficial for time-of-flight (TOF) PET.

However, few Cherenkov photons are detected, making pure Cherenkov detectors challenging for PET systems in which energy information is used to eliminate a large fraction of the scattered gamma rays prior to image reconstruction. Therefore, hybrid Cherenkov detectors are used to achieve both the benefits of the short time burst arising from Cherenkov photons and achieve sufficient energy resolution based on scintillation photons. In hybrid Cherenkov detectors a scintillator material is used as the Cherenkov radiator (i.e., the material in which the gamma rays interact and produce Cherenkov photons). The time characteristics of the Cherenkov light and the scintillation light differ by orders of magnitude. The scintillator material used in a hybrid Cherenkov detector may be, e.g., bismuth germanium oxide (BGO), which has a very high refractive index (~2.15) results in a relatively low energy threshold for Cherenkov emission. The Cherenkov photons are typically detected in times in the few nanosecond range or shorter, limited by the light transport time within the crystal. The scintillation photons, on the other hand, are emitted with an exponential decay constant of ~300 nanoseconds.

As discussed above, the ratio of scintillation light to Cherenkov light varies when the 511 keV energy of the gamma ray is distributed among multiple scattered electrons due to Compton scattering, for example. As described above, fast electrons in the Cherenkov radiator (e.g., a scintillator) will only emit Cherenkov photons when their kinetic energy is above a threshold (determined by n). For the 511 keV gamma rays that are of interest in PET, gamma rays can deposit energy in the scintillation crystal predominantly through the photoelectric effect and the Compton effect. Due to the photoelectric effect, all 511 keV is transferred to a single fast electron, as illustrated in FIG. 10A. Due to the Compton effect, less than 511 keV is transferred to a fast electron, and a lower-energy scattered gamma ray continues to propagate in the scintillator medium, until the scattered gamma ray transfers its energy to a single fast electron via the photoelectric effect, as illustrated in FIG. 10C, or undergoes a second Compton scattering event, as illustrated in FIG. 10E. That is, when an event (gamma interaction) is detected with a total energy (as measured by integrating the scintillation photons) within the 511 keV energy window, it is often the case that the gamma ray deposits energy in two or more fast electrons through a combination of Compton interactions and photoelectric interactions. Because of the threshold effect in Cherenkov emission, there can be a large variation in the number of emitted Cherenkov photons, depending on the precise combination of interactions which result in a deposition of a total of 511 keV in the scintillator. FIGS. 10A-F are illustrative only and are not drawn to scale.

As discussed above, in FIGS. 10A and 10B, the incident 511 keV gamma interacts in a single photoelectric interaction, and the resulting fast electron exceeds the Cherenkov threshold for a relatively long path length, producing a relatively large number of Cherenkov photons. In FIGS. 10C and 10D, the incident 511 keV gamma ray first interacts by way of Compton scatter, and the scattered gamma ray deposits its energy through a photoelectric interaction. In this case, the total deposited energy is 511 keV, like in the first case, but each of the resulting fast electrons start with lower energy and have shorter paths for which they exceed the Cherenkov threshold. The total Cherenkov emission for this case is lower than in FIGS. 10A and 10B. In FIGS. 10E and 10F, the incident 511 keV gamma ray first interacts through two Compton scatters, followed by a photoelectric interaction. In this case, the same 511 keV is divided between three fast electrons, with the fast electron generated in the final interaction not exceeding the Cherenkov threshold. The total Cherenkov emission in this case is even lower than the first case.

Since the walk correction depends on the ratio of Cherenkov to scintillation photons, and that ratio varies for the reasons described above, having a way to apply different walk corrections will improve the timing resolution.

Figure 11A:
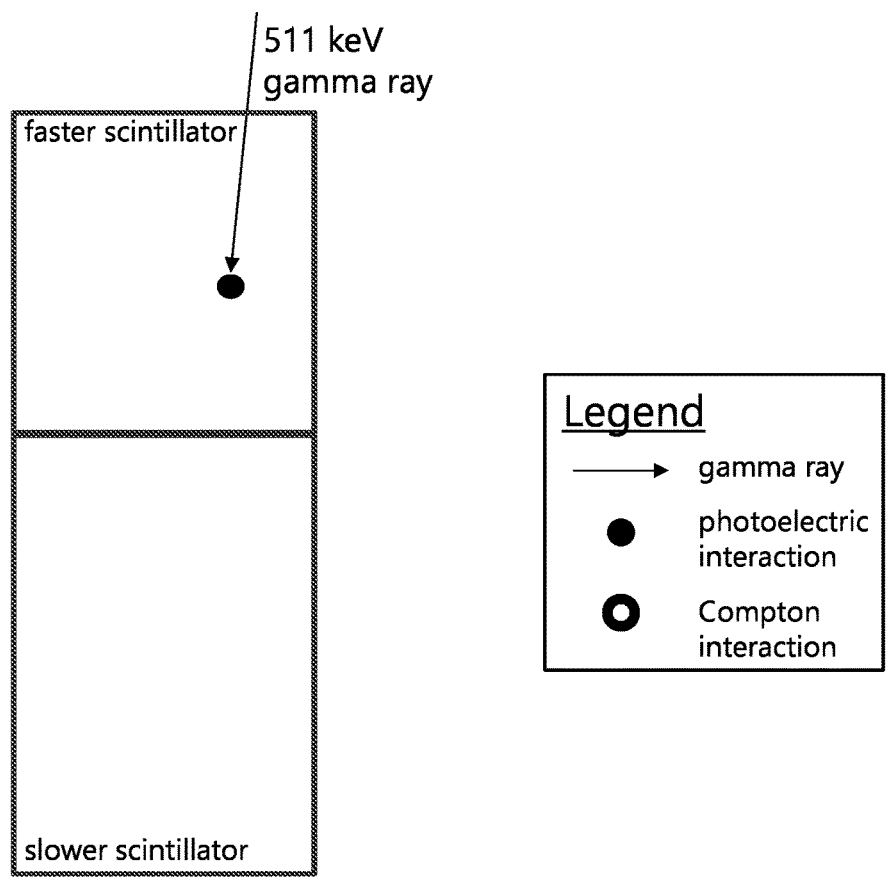
FIG. 11A illustrates a detection event in a phoswich detector that includes a faster scintillator and a slower scintillator, the detection event includes one photoelectric interaction in the slower scintillator, according to one embodiment.
Figure 11B:
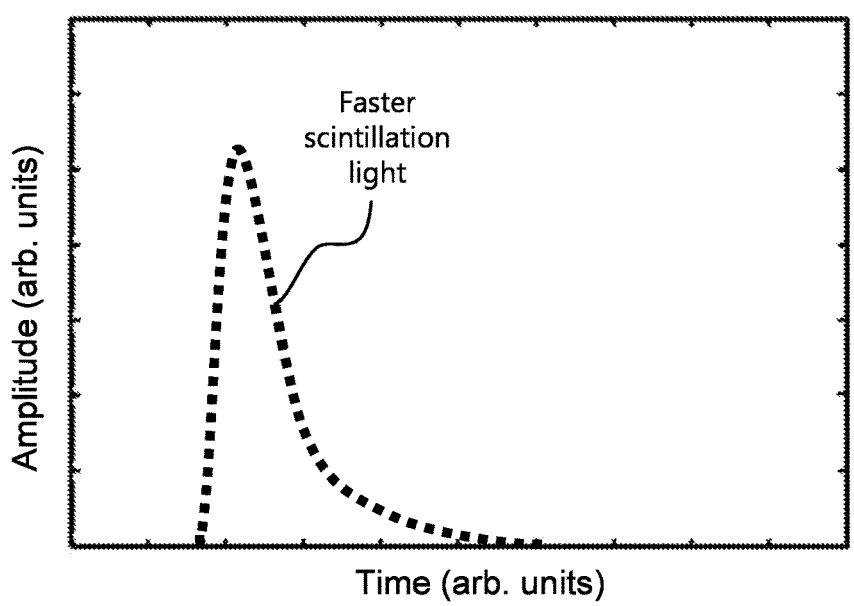
FIG. 11B illustrates a time plot of signals arising from the detection event in FIG. 11A, according to one embodiment.
Figure 11C:
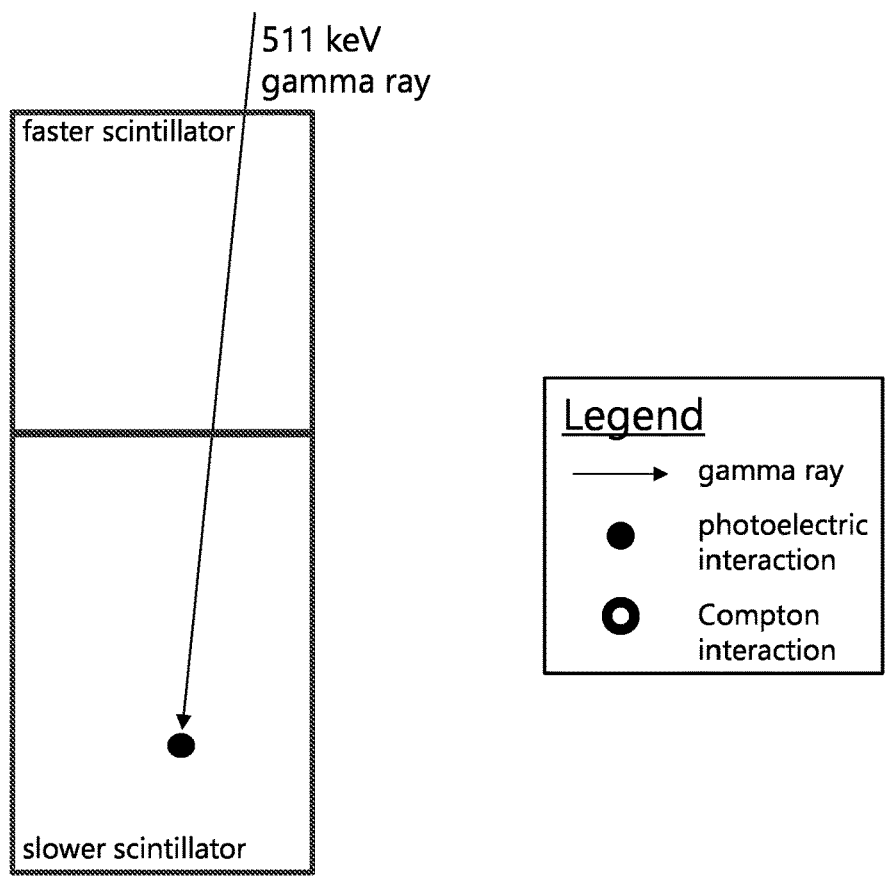
FIG. 11C illustrates a detection event in a phoswich detector, the detection event includes one photoelectric interaction in the faster scintillator, according to one embodiment.
Figure 11D:
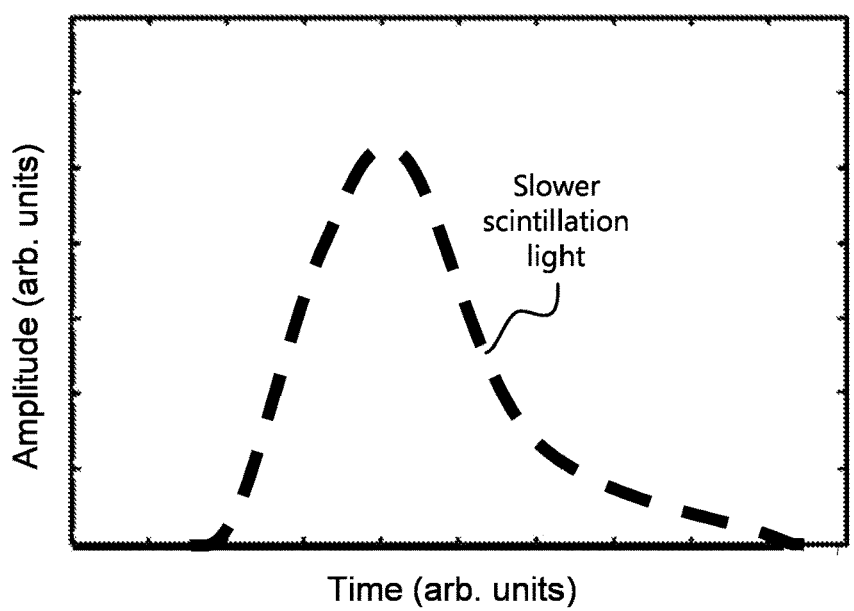
FIG. 11D illustrates a time plot of signals arising from the detection event in FIG. 11C, according to one embodiment.
Figure 11E:
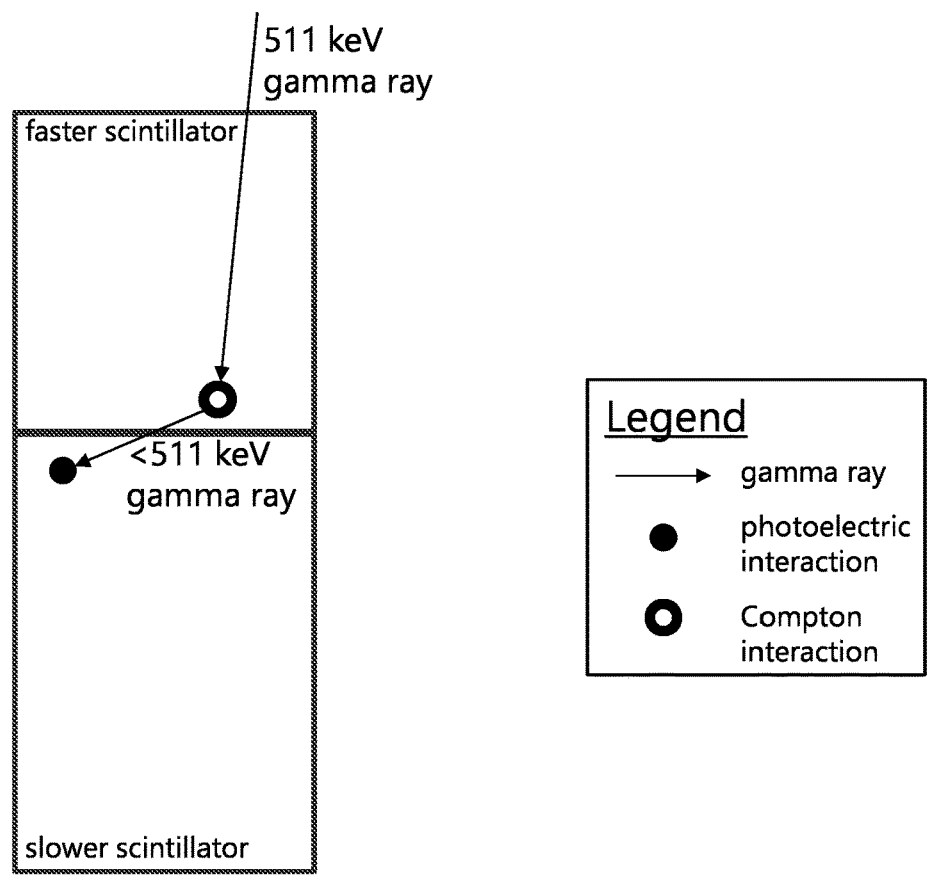
FIG. 11E illustrates a detection event in a phoswich detector, the detection event includes one Compton interaction in the faster scintillator and one photoelectric interaction in the slower scintillator, according to one embodiment.
Figure 11F:
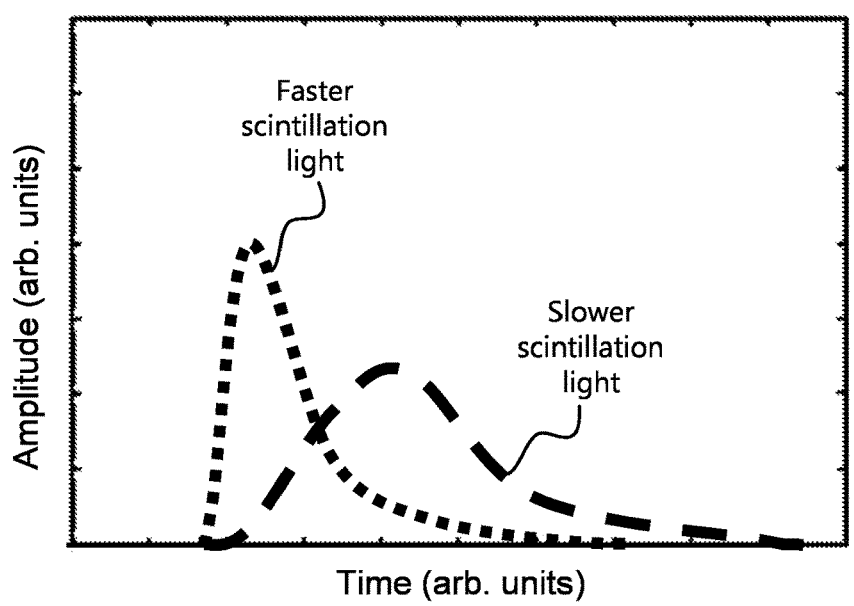
FIG. 11F illustrates a time plot of signals arising from the detection event in FIG. 11E, according to one embodiment.
Figure 11G:
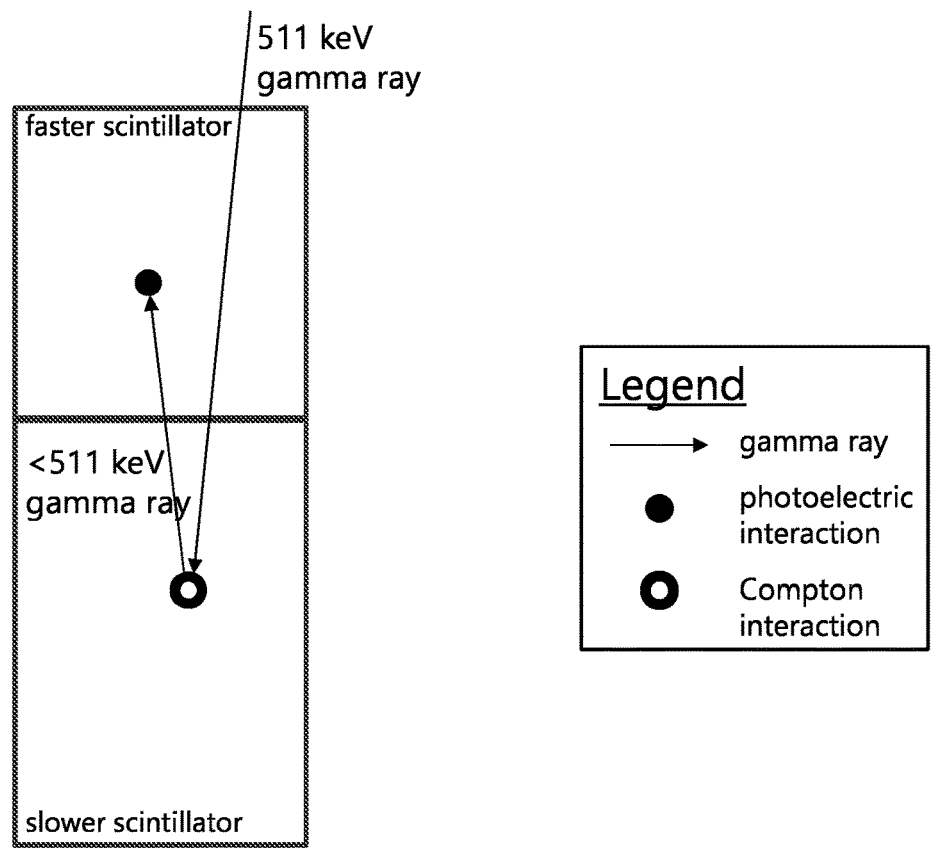
FIG. 11G illustrates a detection event in a phoswich detector, the detection event includes one Compton interaction in the slower scintillator and one photoelectric interaction in the faster scintillator, according to one embodiment.
Figure 11H:
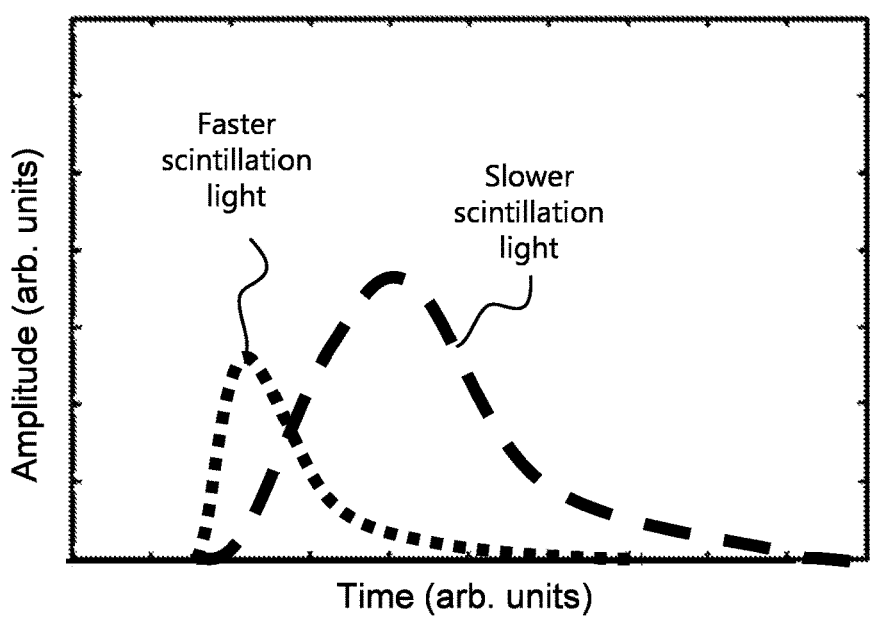
FIG. 11H illustrates a time plot of signals arising from the detection event in FIG. 11G, according to one embodiment.

FIGS. 11A-H illustrate another non-limiting example of detector dynamics giving rise to variations in the ratio between fast and slow components. Here, all of the light derives from scintillation, but the scintillator includes both a fast scintillator and a slow scintillator. In FIGS. 11A and 11B, all the light is generated by the fast scintillator. In FIGS. 11C and 11D, all of the light is generated by the slow scintillator. In FIGS. 11E and 11F, Compton scattering occurs in the fast scintillator and then the energy of the scattered gamma ray is absorbed in the slow scintillator by a photoelectric interaction. In FIGS. 11G and 11H, this is reversed, with Compton scattering occurring in the slow scintillator and then the energy of the scattered gamma ray being absorbed in the fast scintillator. Each of these four cases results in a different distribution between the slow and fast components in the electrical pulses, which are illustrated in FIGS. 11A, 11C, 11E, and 11H.

This type of gamma ray detector using both fast and slow scintillators can be referred to as a "phoswich" detector. The term phoswich comes from a combination of the words phosphor (e.g., scintillator) and sandwich. A phoswich detector uses two or more scintillators, with different emission time characteristics. Phoswich detectors can be used to discriminate between different radiation types (e.g., alpha and gamma). In PET, they are used to improve spatial resolution. For example, phoswich detectors can be used in PET for depth-of-interaction detection. Generally, two or more layers of different scintillators are used, the scintillators have different decay times, and they are read-out by a common set of photosensors and electronics. If the scintillators also have different rise-times, then it is beneficial to use walk correction based on two or more energy measurements, as described herein.

FIGS. 11A-H illustrate various examples of gamma interactions which deposit a total of 511 keV in the phoswich detector. In this case, the two scintillator materials are optically coupled, and they may be read-out by a photosensor on the bottom surface of the lower scintillator. Similar to the case of the Cherenkov detector, discussed above, the relative ratios of the two types generated photons (faster and slower scintillation light, in this case) varies depending on the combination of Compton and photoelectric interactions which result in the overall deposition of 511 keV. In FIGS. 11A and 11B, a single photoelectric interaction results in 511 keV being deposited in the faster scintillator. In FIGS. 11C and 11D, a single photoelectric interaction deposits 511 keV in the slower scintillator. In FIGS. 11E and 11F, Compton interaction in the faster scintillator is followed by photoelectric interaction in the slower scintillator. In FIGS. 11G and 11H, Compton interaction in the slower scintillator is followed by photoelectric interaction in the faster scintillator. In all four cases, the relative ratios of faster and slower scintillation light differ, as illustrated in FIGS. 11A, 11C, 11E, and 11H. A walk correction based on two or more energy (i.e., integrated charge) measurements provided information about the ratios between the faster and slower signals, resulting in better timing performance.

In the examples above it should be noted that although not shown, various alternatives can be implemented. For example, in any of the embodiments illustrated, a backside fill may be used or may be omitted. Alternatively, or additionally, while the active areas have been shown as being substantially square in nature, it should be appreciated that the active areas may be rectangular or other appropriate shapes.

The discussion above refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for determining a time of a photon detection, the apparatus comprising:
   a first circuit configured to measure a time of an electrical pulse generated by detection of a photon,
   a second circuit configured to measure a magnitude of the electrical pulse within a first time window to determine a first magnitude;
   a third circuit configured to measure a magnitude of the electrical pulse within a second time window, which is different from the first time window, to determine a second magnitude; and
   processing circuitry configured to
      determine a time-walk correction based on the first magnitude and the second magnitude, and
      correct the measured time of the electrical pulse using the time-walk correction.

2. The apparatus according to claim 1, further comprising:
   a photodetector that generates a photocurrent in response to the detection of the photon, and
   a buffer amplifier configured to amplify the photocurrent and thereby output the electrical pulse, which feeds into the second circuit and the third circuit.

3. The apparatus according to claim 2, wherein the photon is a gamma-ray photon and the photodetector comprises a conversion material that is a scintillator configured to convert the gamma-ray photon to one or more energetic electrons.

4. The apparatus according to claim 3, wherein
   the scintillator has an index of refraction such that a part of an energy of the gamma-ray photon is converted to Cherenkov radiation contributing to a fast component of the electrical pulse, or
   the photodetector comprises another conversion material in addition to the conversion material, the another conversion material being a fast scintillator relative to the conversion material, the another conversion material contributing to a fast component of the electrical pulse, and the conversion material contributing to a slow component of the electrical pulse.

5. The apparatus according to claim 1, wherein the first circuit is AC-coupled via a capacitor to a photodetector.

6. The apparatus according to claim 1, wherein
   the second time window is staggered in time with respect to the first time window, and/or a mean time of the first time window is different than a mean time of the second time window.

7. The apparatus according to claim 5, wherein the electrical pulse includes a fast component and a slow component, and a ratio of the fast component to the slow component is greater for the first magnitude than for the second magnitude.

8. The apparatus according to claim 1, wherein
   the first circuit includes a first filter that is a high-pass filter or a band-pass filter,
   the second circuit includes a second filter that is a low-pass filter, the second circuit being configured to measure an energy representing, in part, a slow component of the electrical pulse, and
   the third circuit includes a third filter that is a high-pass filter or a band-pass filter, the third circuit being configured to measure an energy representing, in part, a fast component of the electrical pulse.

9. The apparatus according to claim 1, wherein the first circuit further includes
   a comparator circuit configured to output a comparator signal when a rising edge of the electrical pulse exceeds a predefined threshold, and
   a time-to-digital converter configured to generate a digital signal representing a time when the comparator signal is received;

the second circuit further includes
   a first integrator circuit configured to integrate, within i first time window, a charge of the electrical pulse, and
   a first analog-to-digital converter configured to convert the integrated charge in the first time window to a digital value, which digital value is the first magnitude; and the third circuit further includes
   a second integrator circuit configured to integrate, within Ag second time window, the charge of the electrical pulse, and
   a second analog-to-digital converter configured to convert the integrated charge in the second time window to a digital value, which digital value is the second magnitude.

10. The apparatus according to claim 1, wherein the processing circuitry is further configured to determine the time-walk correction based on a function having parameters that were determined by curve fitting calibration data of the time walk as a function of the first magnitude and the second magnitude.

11. The apparatus according to claim 10, wherein the function is factored into a first function of the first magnitude and a second function of the second magnitude, the function being either a sum of the first function and the second function or a product of the first function and the second function.

12. The apparatus according to claim 1, further comprising a fourth circuit configured to measure a magnitude of the electrical pulse within a third time window, which is different from the first time window and is different from the second time window, to determine a third magnitude,
   wherein the processing circuitry is further configured to determine the time-walk correction based on the first magnitude, the second magnitude, and the third magnitude.

13. A method for determining a time of a photon detection, the method comprising:
   measuring, using a first circuit, a time of an electrical pulse generated y detection of a photon;
   measuring, using a second circuit, a magnitude of the electrical pulse within a first time window to determine a first magnitude;
   measuring, using a third circuit, a magnitude of the electrical pulse within a second time window which is different from the first time window, to determine a second magnitude;
   determining a time-walk correction based on the first magnitude and the second magnitude; and
   correcting the measured time of the electrical pulse using the time-walk correction.

14. The method according to claim 13, further comprising:
   generating, using a photodetector, a photocurrent in response to the detection of the photon, and
   amplifying, using a buffer amplifier, the photocurrent, the buffer amplifier outputting the electrical pulse, which feeds into the second circuit and the third circuit.

15. The method according to claim 14, further comprising AC-coupling, via a capacitor, the photodetector to the first circuit.

16. The method according to claim 13, wherein
the second time window is staggered in time with respect to the first time window, and/or a mean time of the first time window is different than a mean time of the second time window.

17. The method according to claim 16, wherein the electrical pulse includes a fast component and a slow component, and a ratio of the fast component to the slow component is greater for the first magnitude than for the second magnitude.

18. The method according to claim 13, further comprising:
filtering, using a first filter, the electrical pulse before the first circuit, the first filter being a high-pass filter or a band-pass filter,
filtering, using a second filter, the electrical pulse before the second circuit, the second filter being a low-pass filter, and
filtering, using a third filter, the electrical pulse before the third circuit, the third filter being a high-pass filter or a band-pass filter.

19. The method according to claim 13, wherein
the step of measuring the time of the electrical pulse further includes
comparing, using a comparator circuit, the electrical pulse to a predefined threshold and outputting a comparator signal when a rising edge of the electrical pulse exceeds the predefined threshold, and
generating, using a time-to-digital converter, a digital signal representing a time when the comparator signal is received;
the step of measuring the first magnitude further includes
integrating, using a first integrator circuit, a charge of the electrical pulse within the first time window, and
converting, using a first analog-to-digital converter, the integrated charge in the first time window to a digital value, which digital value is the first magnitude; and
the step of measuring the second magnitude further includes
converting, using a second integrator circuit, a charge of the electrical pulse within the second time window, and
converting, using a second analog-to-digital converter, the integrated charge in the second time window to a digital value, which digital value is the second magnitude.

20. The method according to claim 13, wherein determining the time-walk correction further includes determining the time-walk correction based on a function having parameters that were determined by curve fitting calibration data of the time walk as a function of the first magnitude and the second magnitude.

* * * * *